(12) United States Patent
Sako et al.

(10) Patent No.: US 11,456,376 B2
(45) Date of Patent: Sep. 27, 2022

(54) SEMICONDUCTOR DEVICE

(71) Applicant: Mitsubishi Electric Corporation, Tokyo (JP)

(72) Inventors: Kohei Sako, Tokyo (JP); Tetsuo Takahashi, Tokyo (JP); Hidenori Fujii, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 20 days.

(21) Appl. No.: 17/204,247

(22) Filed: Mar. 17, 2021

(65) Prior Publication Data
US 2021/0384335 A1 Dec. 9, 2021

(30) Foreign Application Priority Data
Jun. 4, 2020 (JP) ............................. JP2020-097609

(51) Int. Cl.
*H01L 29/739* (2006.01)
*H01L 29/66* (2006.01)
*H01L 29/861* (2006.01)

(52) U.S. Cl.
CPC .... *H01L 29/7397* (2013.01); *H01L 29/66348* (2013.01); *H01L 29/861* (2013.01)

(58) Field of Classification Search
CPC ........... H01L 29/7397; H01L 29/66348; H01L 29/861
USPC ....................................................... 257/140
See application file for complete search history.

(56) References Cited

U.S. PATENT DOCUMENTS

| 2002/0153586 A1* | 10/2002 | Majumdar ........... H01L 29/7395 257/E29.198 |
| 2008/0093697 A1 | 4/2008 | Kaneda et al. |
| 2012/0043581 A1* | 2/2012 | Koyama ............. H01L 29/8613 257/140 |
| 2016/0336404 A1 | 11/2016 | Naito |

FOREIGN PATENT DOCUMENTS

| JP | 2008-103590 A | 5/2008 |
| JP | 4761644 B2 | 8/2011 |
| JP | 2016181551 A * | 10/2016 |
| JP | 2016-219774 A | 12/2016 |
| JP | 2017098359 A * | 6/2017 |

* cited by examiner

*Primary Examiner* — Igwe U Anya
(74) *Attorney, Agent, or Firm* — Studebaker & Brackett PC

(57) ABSTRACT

A semiconductor device includes an IGBT region and a diode region provided to be adjacent to each other in a semiconductor substrate further includes: a boundary trench having, in a position in which the IGBT region and the diode region are adjacent to each other in plan view, a bottom surface positioned in a drift layer to be deeper than an active trench or a dummy trench, and one side wall and another side wall that face each other; and a boundary trench gate electrode, which faces a base layer, an anode layer, and the drift layer via a boundary trench insulating film and is provided from the one side wall to the other side wall of the boundary trench across a region that faces the drift layer in the boundary trench.

12 Claims, 25 Drawing Sheets

A-A CROSS SECTION

B-B CROSS SECTION

SEMICONDUCTOR DEVICE

BACKGROUND OF THE INVENTION

Field

The present disclosure relates to a semiconductor device.

Background

In recent years, small-sized inverter devices are required in the field of vehicles, the field of industrial machinery, or the field of consumer appliances from the viewpoint of energy conservation. For example, in JP 2008-103590 A, in order to downsize an inverter device, a semiconductor device in which an insulated gate bipolar transistor (IGBT) and a diode are formed on one semiconductor substrate is proposed.

However, in the semiconductor device of JP 2008-103590 A, electron holes that are minority carriers flow into a diode region from an IGBT region. Therefore, there has been a problem in that the recovery current at the time of a recovery operation increases and the breakdown resistance of the diode decreases as compared to when an IGBT and a diode that are individual parts are used by being parallelly connected to each other.

SUMMARY

The present disclosure has been made in order to solve the abovementioned problems, and an object thereof is to provide a semiconductor device, which suppresses the flow-in of electron holes from an region to a diode region and of which breakdown resistance at the time of a recovery operation is improved.

The features and advantages of the present disclosure may be summarized as follows.

According to an aspect of the present disclosure, a semiconductor device includes a semiconductor substrate having a first-conductivity-type drift layer between a first main surface and a second main surface opposite to the first main surface; and an IGBT region and a diode region provided to be adjacent to each other in the semiconductor substrate, wherein the IGBT region includes a second-conductivity-type base layer provided on a front layer of the semiconductor substrate on the first main surface side; a first-conductivity-type emitter layer selectively provided on a front layer of the base layer on the first main surface side; an active trench gate including an active trench gate electrode, which is provided so as to face the drift layer via an insulating film and to which a gate voltage is applied, in each of a plurality of active trenches that are formed to be aligned in a first direction along the first main surface of the semiconductor substrate and pass through the emitter layer and the base layer; and a second-conductivity-type collector layer provided on a front layer of the semiconductor substrate on the second main surface side; the diode region includes: a second-conductivity-type anode layer provided on the front layer of the semiconductor substrate on the first main surface side; a first-conductivity-type cathode layer provided on the front layer of the semiconductor substrate on the second main surface side; and a dummy trench gate having a dummy trench gate electrode, which faces the drift layer via an insulating film and to which the gate voltage is not applied, in each of a plurality of dummy trenches that are formed to be aligned in the first direction of the semiconductor substrate and pass through the anode layer; and the semiconductor device further includes: a boundary trench having, in a position in which the IGBT region and the diode region are adjacent to each other in plan view, a bottom surface positioned in the drift layer to be deeper than the active trench or the dummy trench, and one side wall and another side wall that face each other and connect the bottom surface and the first main surface to each other; and a boundary trench gate electrode, which faces the base layer, the anode layer, and the drift layer via a boundary trench insulating film and is provided from the one side wall side to the other side wall side of the boundary trench across a region that faces the drift layer, in the boundary trench in which the bottom surface, the one side wall, and the other side wall are covered with the boundary trench insulating film.

Other and further objects, features and advantages of the disclosure will appear more fully from the following description.

DESCRIPTION OF EMBODIMENTS

Figure 1:
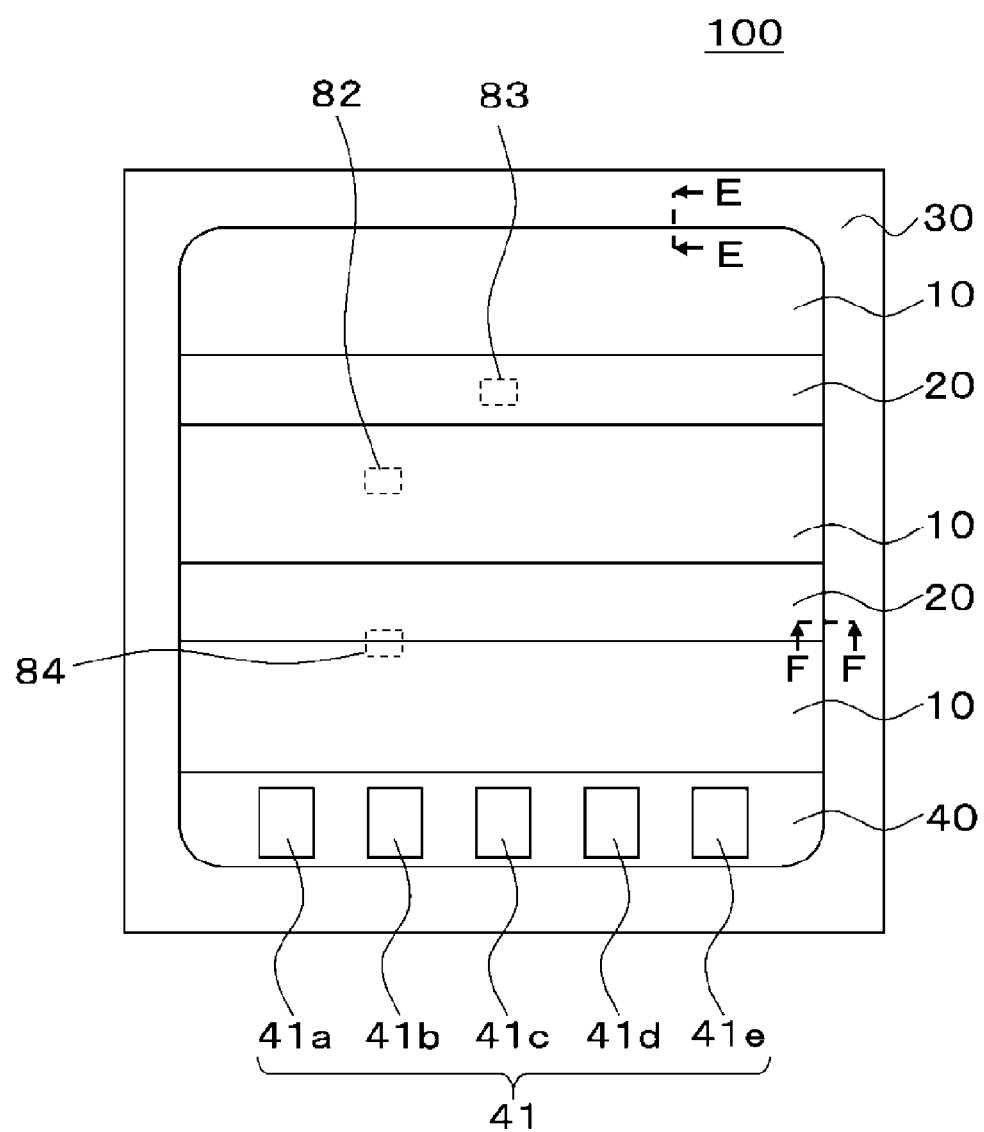
FIG. 1 is a plan view illustrating a semiconductor device according to a first embodiment.

Embodiments are described below with reference to the drawings. The drawings are schematically illustrated, and hence the mutual relationships between sizes and positions may be changed. In the description below, the same or corresponding components may be denoted by the same reference characters, and repetitive descriptions may be omitted.

In the description below, terms meaning predetermined positions and directions such as "upper", "lower", and "side" may be used, but those terms are used for convenience in order to facilitate the understanding of the details of the embodiments and do not limit the positions and the directions when the embodiments are carried out.

In the description below, n and p indicate the conductivity types of a semiconductor. In the present disclosure, a first-conductivity-type is described as an n-type and a second-conductivity-type is described as a p-type. In addition, n– indicates that the impurity concentration is lower than n, and n+ indicates that the impurity concentration is higher than n. Similarly, p– indicates that the impurity concentration is lower than p, and p+ indicates that the impurity concentration is higher than p.

First Embodiment

Figure 2:
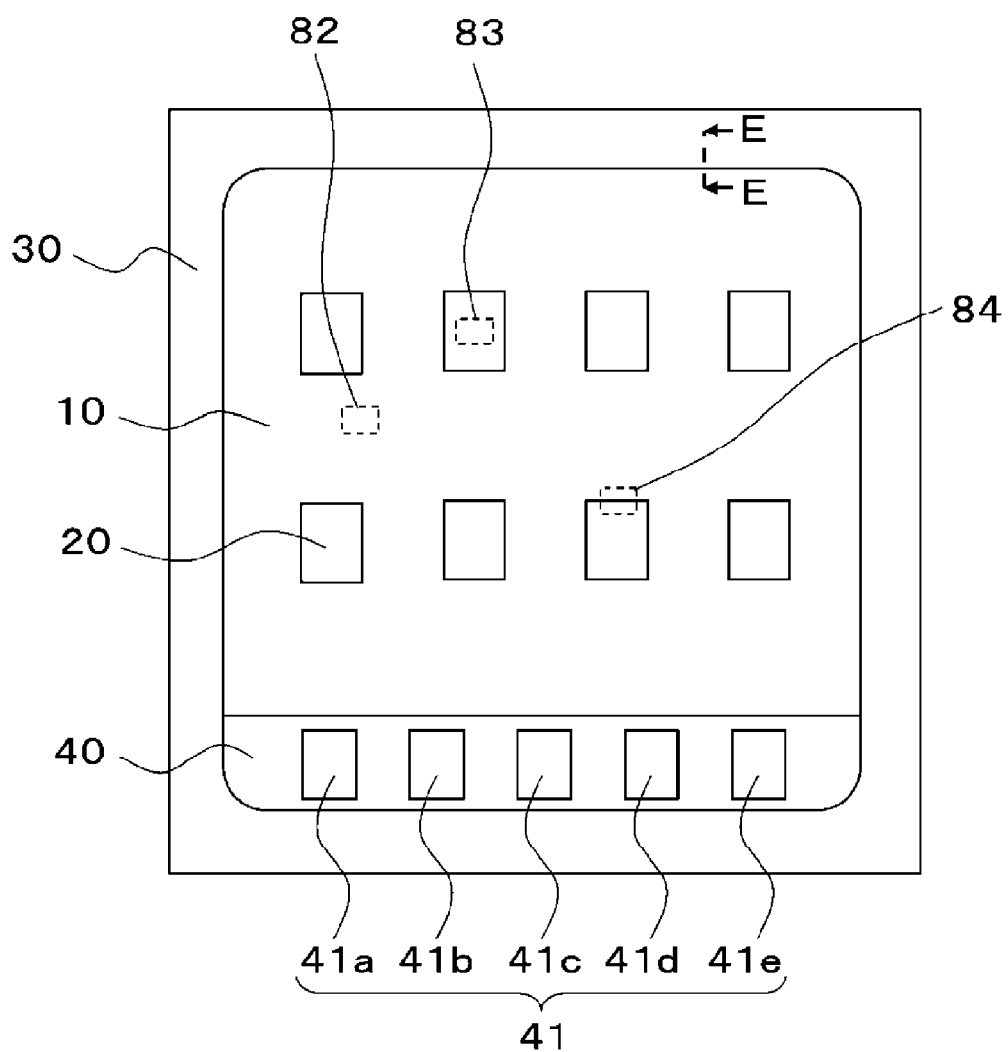
FIG. 2 is a plan view illustrating a semiconductor device having another configuration according to the first embodiment.

FIG. 1 is a plan view illustrating a semiconductor device according to a first embodiment and illustrates a semiconductor device that is a reverse conducting IGBT (RC-IGBT). FIG. 2 is a plan view illustrating a semiconductor device having another configuration according to the first embodiment and illustrates a semiconductor device that is an RC-IGBT having the other configuration. In a semiconductor device 100 illustrated in FIG. 1, IGBT regions 10 and diode regions 20 are provided to be aligned in a stripe form, and the semiconductor device 100 may be simply referred to as a "stripe type". In a semiconductor device 101 illustrated in FIG. 2, a plurality of the diode regions 20 are provided in the longitudinal direction and the transverse direction, and the IGBT region 10 is provided around the diode region 20. The semiconductor device 101 may be referred to as an "island type". In the description below, description is made with use of the stripe type, but the present disclosure may be applied to either one of the stripe type and the island type.

In FIG. 1, the semiconductor device 100 includes the IGBT regions 10 and the diode regions 20 in one semiconductor device. The IGBT regions 10 and the diode regions 20 extend from one end side to the other end side of the semiconductor device 100 and are alternately provided in a stripe form in a direction orthogonal to the extending direction of the IGBT regions 10 and the diode regions 20. In FIG. 1, three IGBT regions 10 and two diode regions are illustrated, and a configuration in which all of the diode regions 20 are interposed between the IGBT regions 10 is illustrated. However, the number of the IGBT regions 10 and the diode regions 20 are not limited the above. The number of the IGBT regions 10 may be three or more or three or less, and the number of the diode regions 20 may also be two or more or two or less.

The places of the IGBT regions 10 and the diode regions 20 in FIG. 1 may be replaced with each other, and all of the IGBT regions 10 may be interposed between the diode regions 20. One IGBT region 10 and one diode region 20 may be provided to be adjacent to each other.

As illustrated in FIG. 1, a pad region 40 is provided to be adjacent to the IGBT region 10 on the lower side of the paper. The pad region 40 is a region in which control pads 41 for controlling the semiconductor device 100 are provided. The IGBT regions 10 and the diode regions 20 are collectively referred to as a cell region. A terminal region 30 is provided around a region obtained by combining the cell region and the pad region 40 in order to maintain the withstand voltage of the semiconductor device 100. In the terminal region 30, a well-known withstand voltage maintaining structure can be selected, as appropriate, and provided. In the withstand voltage maintaining structure, for example, a field limiting ring (FLR) in which the cell region is surrounded by a p-type terminal well layer of a p-type semiconductor and a variation of lateral doping (VLD) in which the cell region is surrounded by a p-type well layer having a concentration gradient may he provided on the first main surface side that is the front surface side of the semiconductor device 100. The number of the ring-shaped p-type terminal well layers used in the FLR and the concentration distribution used in the VLD may be selected, as appropriate, in accordance with the withstand voltage design of the semiconductor device 100. The p-type terminal well layer may be provided across almost the entire region of the pad region 40, and an IGBT cell and a diode cell may he provided in the pad region 40.

The control pads 41 may be a current sensing pad 41a, a Kelvin emitter pad 41b, agate pad 41c, and temperature sensing diode pads 41d and 41e, for example. The current sensing pad 41a is a control pad for detecting current that flows through the cell region of the semiconductor device 100, and is a control pad electrically connected to some IGBT cells or diode cells of the cell region so that, when current flows through the cell region of the semiconductor device 100, current that is a fraction to several ten thousandth of the current that flows through the entire cell region flows therethrough.

The Kelvin emitter pad 41b and the gate pad 41c are control pads to which a gate drive voltage for controlling the ON/OFF of the semiconductor device 100 is applied. The Kelvin emitter pad 41b is electrically connected to a p-type base layer of the IGBT cell, and the gate pad 41c is electrically connected to a gate trench electrode of the IGBT cell. The Kelvin emitter pad 41b and the p-type base layer may be electrically connected to each other via a p+ type contact layer. The temperature sensing diode pads 41d and 41e are control pads electrically connected to an anode and a cathode of a temperature sensing diode provided in the semiconductor device 100. The temperature sensing diode pads 41d and 41e measure the voltage between the anode and the cathode of the temperature sensing diode (not shown) provided in the cell region, to thereby measure the temperature of the semiconductor device 100.

Figure 3:
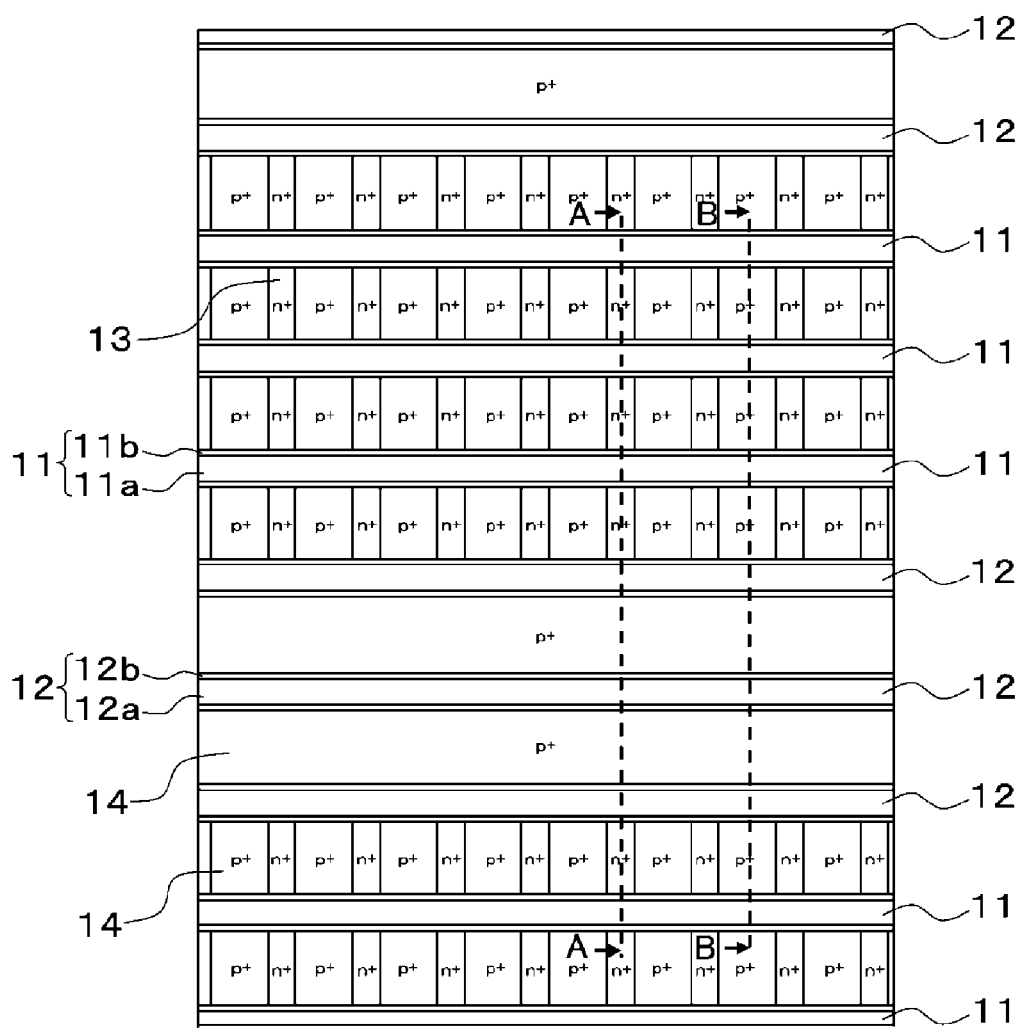
FIG. 3 is a partially-enlarged plan view illustrating the configuration of the IGBT region of the semiconductor device according to the first embodiment.
Figure 4:
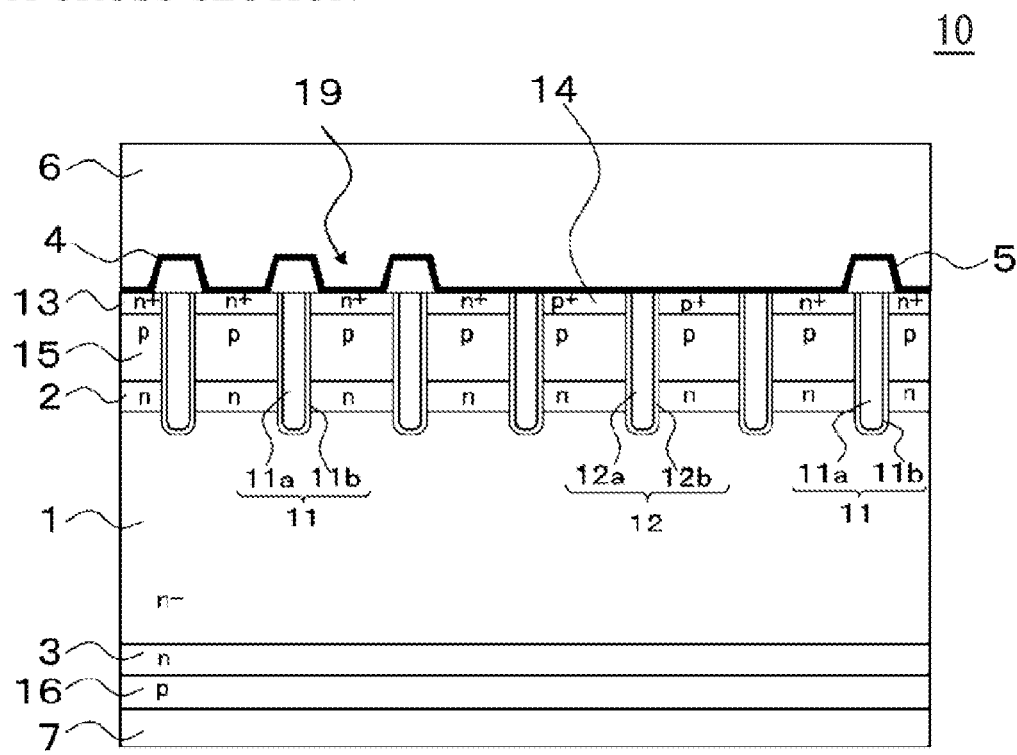
FIG. 4 and FIG. 5 are cross-sectional views illustrating the configuration of the IGBT region of the semiconductor device according to the first embodiment.
Figure 5:
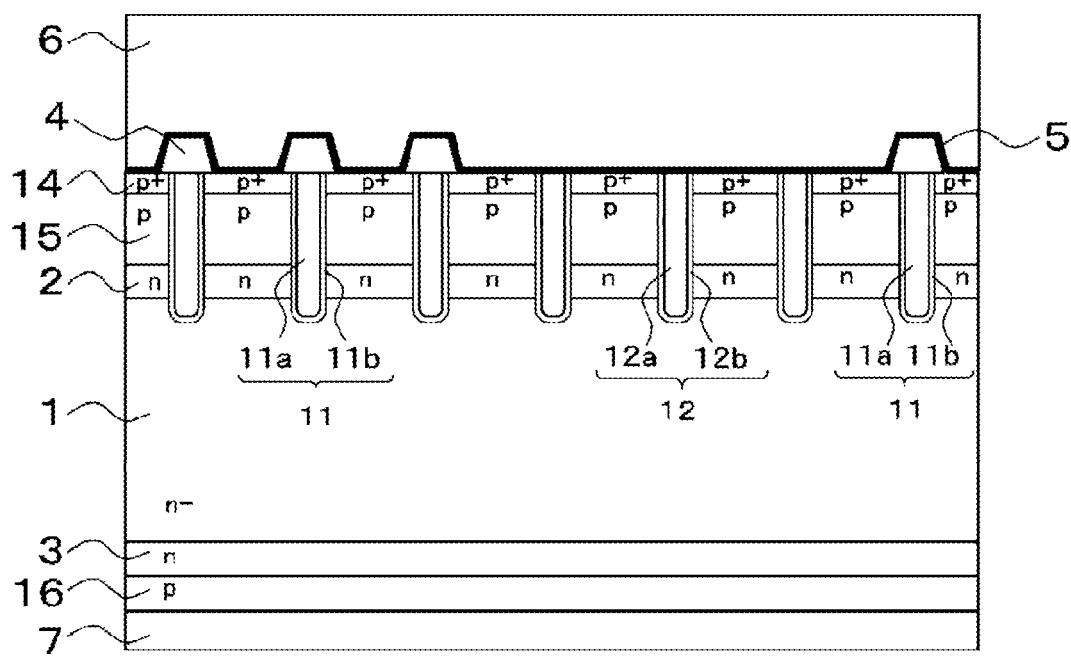

FIG. 3 is a partially-enlarged plan view illustrating the configuration of the IGBT region of the semiconductor device according to the first embodiment and illustrates the configuration of the IGBT region of the semiconductor device that is an RC-IGBT. FIG. 4 and FIG. 5 are cross-sectional views illustrating the configuration of the IGBT region of the semiconductor device according to the first embodiment and illustrate the configuration of the IGBT region of the semiconductor device that is an RC-IGBT. FIG. 3 illustrates a region surrounded by a broken line 82 in the semiconductor device 100 illustrated in FIG. 1 or the semiconductor device 101 illustrated in FIG. 2 in an enlarged manner. FIG. 4 is a cross-sectional view of the semiconductor device 100 or the semiconductor device 101 illustrated in FIG. 3 taken along broken line A-A, and FIG. 5 is a cross-sectional view of the semiconductor device 100 or the semiconductor device 101 illustrated in FIG. 3 taken along broken line B-B.

As illustrated in FIG. 3, in the IGBT region 10, active trench gates 11 and dummy trench gates 12 are provided in a stripe form. In the semiconductor device 100, the active trench gates 11 and the dummy trench gates 12 extend in the longitudinal direction of the IGBT region 10, and the longitudinal direction of the IGBT region 10 are the longitudinal direction of the active trench gates 11 and the dummy trench gates 12. Meanwhile, in the semiconductor device 101, the paper left-right direction may be the longitudinal direction of the active trench gates 11 and the dummy trench gates 12, or the paper up-down direction may be the longitudinal direction of the active trench gates 11 and the dummy trench gates 12.

The active trench gate 11 includes a gate trench electrode 11a via a gate trench insulating film 11b in a trench formed in the semiconductor substrate. The dummy trench gate 12 includes a dummy trench electrode 12a via a dummy trench insulating film 12b in a trench formed in the semiconductor substrate. The gate trench electrode 11a of the active trench gate 11 is electrically connected to the gate pad 41c. The dummy trench electrode 12a of the dummy trench gate 12 is electrically connected to an emitter electrode provided on a first main surface of the semiconductor device 100 or the semiconductor device 101. In other words, a gate drive voltage can be applied to the active trench gate 11, but the gate drive voltage cannot be applied to the dummy trench gate 12.

On both sides of the active trench gate 11 in the width direction, n+ type source layers 13 are provided so as to be in contact with the gate trench insulating film 11b. The n+ type source layers 13 are provided along the extending direction of the active trench gate 11 so as to alternate with p+ type contact layers 14. The p+ type contact layer 14 is also provided between two adjacent dummy trench gates 12.

As illustrated in FIG. 3, in the IGBT region 10 of the semiconductor device 100 or the semiconductor device 101, three dummy trench gates 12 are aligned next to three aligned active trench gates 11, and three active trench gates 11 are aligned next to the three aligned dummy trench gates 12. The IGBT region 10 has a configuration in which a set of the active trench gates 11 and a set of the dummy trench gates 12 are alternately aligned as above. The number of the active trench gates 11 included in one set of the active trench gates 11 is three in FIG. 3, but the number only needs to be one or more. The number of the dummy trench gates 12 included in one set of the dummy trench gates 12 may be one or more, or the number of the dummy trench gates 12 may be zero. In other words, all of the trenches provided in the IGBT region 10 may be the active trench gates 11.

FIG. 4 is a cross-sectional view of the semiconductor device 100 or the semiconductor device 101 taken along broken line A-A in FIG. 3 and illustrates a cross-sectional view of the IGBT region 10. The semiconductor device 100 or the semiconductor device 101 has an n− type drift layer 1 formed by a semiconductor substrate. In FIG. 4, the semiconductor substrate ranges from the n+ type source layers 13 and the p+ type contact layer 14 to a p-type collector layer 16. In FIG. 4, paper upper ends of the n+ type source layers 13 and the p+ type contact layer 14 are referred to as the first main surface of the semiconductor substrate, and a paper lower end of the p-type collector layer 16 is referred to as a second main surface of the semiconductor substrate. The first main surface of the semiconductor substrate is a main surface of the front surface side of the semiconductor device 100, and the second main surface of the semiconductor substrate is a main surface of a rear surface side of the semiconductor device 100. The semiconductor device 100 has the n− type drift layer 1 between the first main surface and the second main surface opposite to the first main surface in the IGBT region 10 that is a cell region.

As illustrated in FIG. 4, in the IGBT region 10, an n-type carrier accumulation layer 2 in which the concentration of the n-type impurity is higher than that of the n− type drift layer 1 is provided on the first min surface side of the n− type drift layer 1. In the semiconductor device 100 or the semiconductor device 101, the n− type drift layer 1 may also be provided in the region of the n-type carrier accumulation layer 2 illustrated in FIG. 4 without providing the n-type carrier accumulation layer 2. By providing the n-type carrier accumulation layer 2, the conduction loss when the current flows through the IGBT region 10 can be reduced. The n-type carrier accumulation layer 2 and the n− type drift layer 1 may be collectively referred to as a drift layer.

The n-type carder accumulation layer 2 is formed by ion-implanting an n-type impurity into the semiconductor substrate forming the type drift layer 1 and diffusing the implanted n-type impurity in the semiconductor substrate that is the n− type drift layer 1 by annealing thereafter.

On the first main surface side of the n-type carrier accumulation layer 2, a p-type base layer 15 is provided. The p-type base layer 15 is in contact with the gate trench insulating films 11b of the active trench gates 11. On the first main surface side of the p-type base layer 15, the n+ type source layers 13 are provided so as to be in contact with the gate trench insulating films 11b of the active trench gates 11, and the p+ type contact layer 14 is provided in the remaining region. The n+ type source layers 13 and the p+ type contact layer 14 form the first main surface of the semiconductor substrate. The p+ type contact layer 14 is a region in which the concentration of the p-type impurity is higher than that of the p-type base layer 15. When the p+ type contact layer 14 and the p-type base layer 15 need to be distinguished from each other, the p+ type contact layer 14 and the p-type base layer 15 may be individually referred to. The p+ type contact layer 14 and the p-type base layer 15 may be collectively referred to as a p-type base layer.

In the semiconductor device 100 or the semiconductor device 101, an n-type buffer layer 3 in which the concentration of the n-type impurity is higher than that of the n− type drift layer 1 is provided on the second main surface side of the n− type drift layer 1. The n-type buffer layer 3 is provided in order to suppress the punch-through of a depletion layer that extends from the p-type base layer 15 to the second main surface side when the semiconductor device 100 or the semiconductor device 101 is in an OFF state. The n-type buffer layer 3 may be formed by implanting phosphorus (P) or protons (H+) or may be formed by implanting both of phosphorus (P) and protons (H+), for example. In the semiconductor device 100 or the semiconductor device 101, the n− type drift layer 1 may also be provided in the region of the n-type buffer layer 3 illustrated in FIG. 4 without providing the n-type buffer layer 3. The n-type buffer layer 3 and the n− type drift layer 1 may be collectively referred to as a drift layer.

In the semiconductor device 100 or the semiconductor device 101, the p-type collector layer 16 is provided on the second main surface side of the n-type buffer layer 3. In other words, the p-type collector layer 16 is provided between the n− type drift layer 1 and the second main surface. The p-type collector layer 16 forms the second main surface of the semiconductor substrate. The p-type collector layer 16 is not only provided in the IGBT region 10 and is also provided in the terminal region 30, and the part of the p-type collector layer 16 provided in the terminal region 30 forms a p-type terminal collector layer. The p-type collector layer 16 may be provided such that a part thereof bulges out from the IGBT region 10 to the diode region 20.

As illustrated in FIG. 4, in the semiconductor device 100 or the semiconductor device 101, trenches passing through the p-type base layer 15 from the first main surface of the semiconductor substrate and reaching the n− type drift layer 1 are formed. The active trench gates 11 are formed by providing the gate trench electrodes 11a in the trenches via the gate trench insulating films 11b. The gate trench electrodes 11a face the n− type drift layer 1 via the gate trench insulating films 11b. The dummy trench gates 12 are formed by providing the dummy trench electrodes 12a in the trenches via the dummy trench insulating films 12b. The dummy trench electrodes 12a face the n− type drift layer 1 via the dummy trench insulating films 12b. The gate trench insulating films 11b of the active trench gates 11 are in contact with the p-type base layer 15 and the n+ type source layers 13. When a gate drive voltage is applied to the gate trench electrode 11a, a channel is formed in the p-type base layer 15 in contact with the gate trench insulating film 11b of the active trench gate 11.

As illustrated in FIG. 4, an interlayer insulating film 4 is provided on the gate trench electrodes 11a of the active trench gates 11. A barrier metal 5 is formed on the interlayer insulating film 4 and on a region of the first main surface of the semiconductor substrate in which the interlayer insulating film 4 is not provided. The barrier metal 5 may be a conductor containing titanium (Ti), for example, may be titanium nitride, for example, or may be TiSi obtained by alloying titanium and silicon (Si).

As illustrated in FIG. 4, the barrier metal 5 is in ohmic contact with the n+ type source layers 13, the p+ type contact layer 14, and the dummy trench electrodes 12a, and is electrically connected to the n+ type source layers 13, the p+ type contact layer 14, and the dummy trench electrodes 12a. On the barrier metal 5, an emitter electrode 6 is provided. For example, the emitter electrode 6 may be formed by an aluminum alloy such as an aluminum-silicon alloy (Al—Si alloy), and may be an electrode formed by a plurality of layers of metal films in which a plating film is formed by electroless plating or electroplating on an electrode formed by an aluminum alloy. The plating film formed by electroless plating or electroplating may be a nickel (Ni) plating film, for example.

When the width of a contact hole 19 provided on the interlayer insulating film 4 is narrow and satisfactory embedding cannot be obtained with the emitter electrode 6, tungsten having a more satisfactory embedding property than the emitter electrode 6 may be positioned on the contact hole 19 and the emitter electrode 6 may be provided on the tungsten. The emitter electrode 6 may be provided on the type source layers 13, the p+ type contact layer 14, and the dummy trench electrodes 12a without providing the barrier metal 5. It is possible to provide the barrier metal 5 only on n-type semiconductor layers such as the n+ type source layers 13. The barrier metal 5 and the emitter electrode 6 may be collectively referred to as an emitter electrode.

In FIG. 4, a configuration in which the contact holes 19 are provided without providing the interlayer insulating film 4 on the dummy trench electrodes 12a of the dummy trench gates 12 is illustrated. However, the interlayer insulating film 4 may be formed on the dummy trench electrodes 12a of the dummy trench gates 12. When the interlayer insulating film 4 is formed on the dummy trench electrodes 12a of the dummy trench gates 12, the emitter electrode 6 and the dummy trench electrodes 12a only need to be electrically connected to each other at another cross section.

On the second main surface side of the p-type collector layer 16, a collector electrode 7 is provided. As with the emitter electrode 6, the collector electrode 7 may be formed by an aluminum alloy or by an aluminum alloy and a plating film. The collector electrode 7 may have a configuration different from that of the emitter electrode 6. The collector electrode 7 is in ohmic contact with the p-type collector layer 16 and is electrically connected to the p-type collector layer 16.

FIG. 5 is a cross-sectional view of the semiconductor device 100 or the semiconductor device 101 taken along broken line B-B in FIG. 3 and is a cross-sectional view of the IGBT region 10. FIG. 5 is different from the cross-sectional view taken along broken line A-A illustrated in FIG. 4 in that the n+ type source layers 13 provided on the first main surface side of the semiconductor substrate so as to be in contact with the active trench gates 11 cannot be seen in the cross section of FIG. 5 taken along broken line B-B. In other words, as illustrated in FIG. 3, the n+ type source layers 13 are selectively provided on the first main surface side of the p-type base layers. The p-type base layers referred to here are the p-type base layers collectively meaning the p-type base layer 15 and the p+ type contact layer 14.

Figure 6:
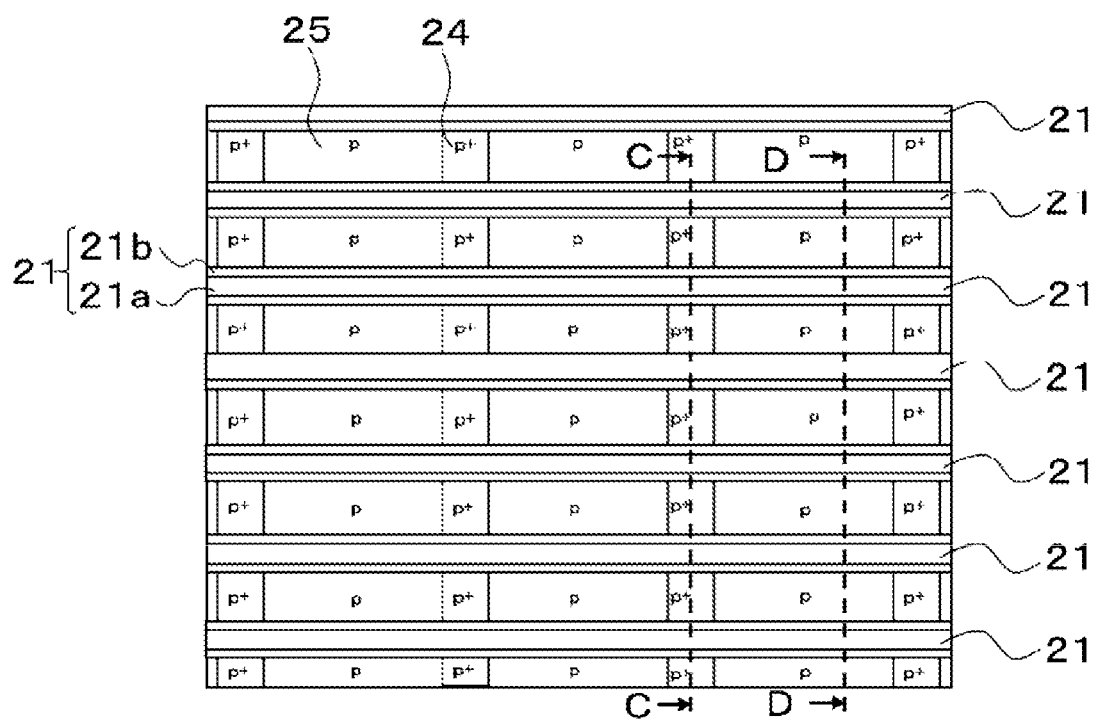
FIG. 6 is a partially-enlarged plan view illustrating the configuration of the diode region of the semiconductor device according to the first embodiment.
Figure 7:
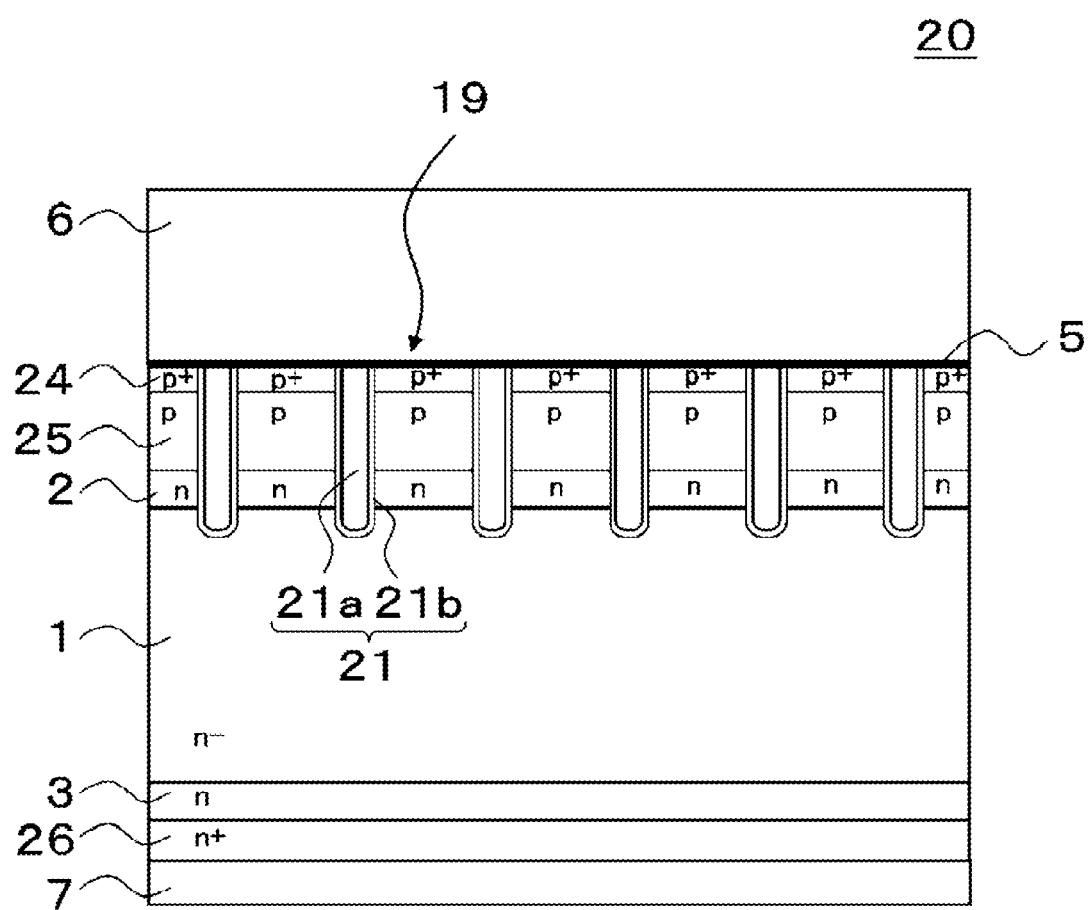
FIG. 7 and FIG. 8 are cross-sectional views illustrating the configurations of the diode region of the semiconductor device according to the first embodiment.
Figure 8:
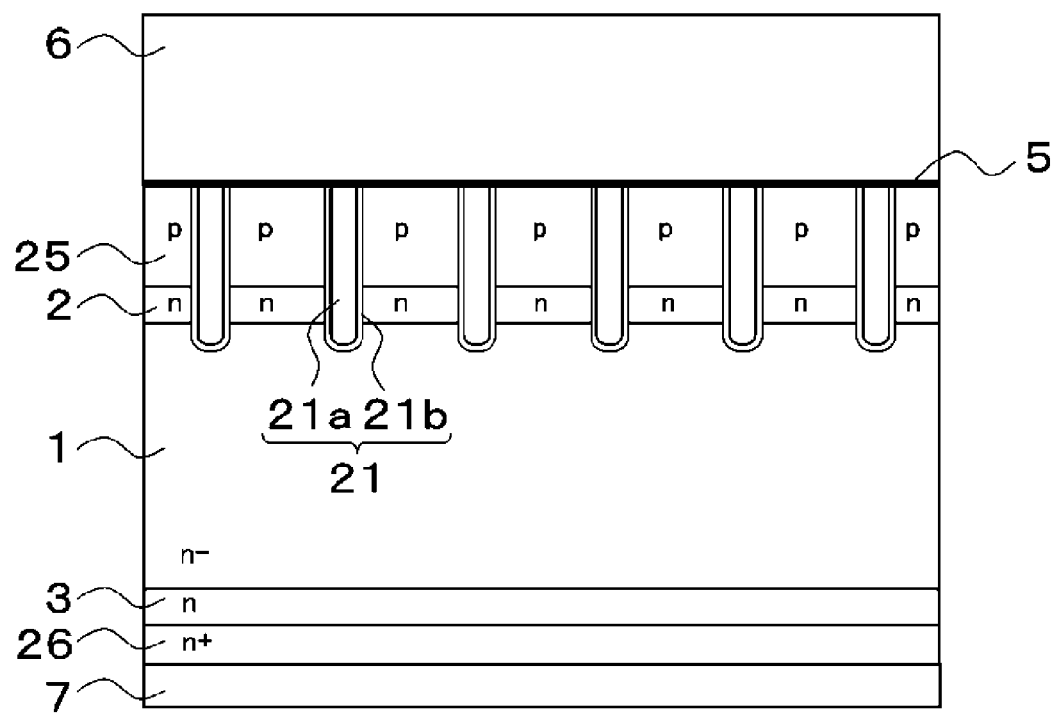

FIG. 6 is a partially-enlarged plan view illustrating the configuration of the diode region of the semiconductor device according to the first embodiment and illustrates the configuration of the diode region of the semiconductor device that is an RC-IGBT. FIG. 7 and FIG. 8 are cross-sectional views illustrating the configurations of the diode region of the semiconductor device according to the first embodiment and illustrate the configurations of the diode region of the semiconductor device that is an RC-IGBT. FIG. 6 illustrates the region surrounded by a broken line 83 in the semiconductor device 100 illustrated in FIG. 1 or the semiconductor device 101 in an enlarged manner. FIG. 7 is a cross-sectional view of the semiconductor device 100 illustrated in FIG. 6 taken along broken line C-C. FIG. 8 is a cross-sectional view of the semiconductor device 100 illustrated in FIG. 6 taken along broken line D-D.

Diode trench gates 21 extend from one end side of the diode region 20 that is a cell region to the other end side opposite thereto along the first main surface of the semiconductor device 100 or the semiconductor device 101. Each of the diode trench gates 21 has a diode trench electrode 21a in a trench formed in the semiconductor substrate of the diode region 20 via a diode trench insulating film 21b. The diode trench electrode 21a faces the n− type drift layer 1 via the diode trench insulating film 21b. A p+ type contact layer 24 and a p-type anode layer 25 are provided between two adjacent diode trench gates 21. The p+ type contact layer 24 and the p-type anode layer 25 are alternately provided in the longitudinal direction of the diode trench gate 21, FIG. 7 is a cross-sectional view of the semiconductor device 100 or the semiconductor device 101 taken along broken line C-C in FIG. 6 and is a cross-sectional view of the diode region 20. The semiconductor device 100 or the semiconductor device 101 has the n− type drift layer 1 formed by a semiconductor substrate also in the diode region 20 as in the IGBT region 10. The n− type drift layer 1 in the diode region 20 and the n− type drift layer 1 in the IGBT region 10 are integrally formed in a continuous manner and are formed by the same semiconductor substrate. In FIG. 7, the semiconductor substrate ranges from the p+ type contact layer 24 to an n+ type cathode layer 26. In FIG. 7, the paper upper end of the p+ type contact layer 24 is referred to as the first main surface of the semiconductor substrate, and the paper lower end of the n+ type cathode layer 26 is referred to as the second main surface of the semiconductor substrate. The first main surface in the diode region 20 and the first main surface in the IGBT region 10 are the same surface, and the second main surface in the diode region 20 and the second main surface in the IGBT region 10 are the same surface.

As illustrated in FIG. 7, also in the diode region 20, as in the IGBT region 10, the n-type carrier accumulation layer 2 is provided on the first main surface side of the n− type drift layer 1, and the n-type buffer layer 3 is provided on the second main surface side of the n− type drift layer 1. The n-type carrier accumulation layer 2 and the n-type buffer layer 3 provided in the diode region 20 have the same configuration as the n-type carrier accumulation layer 2 and the n-type buffer layer 3 provided in the IGBT region 10. The n-type carrier accumulation layer 2 does not necessarily need to be provided in the IGBT region 10 and the diode region 20. Even when the n-type carrier accumulation layer 2 is provided in the IGBT region 10, it is possible to not provide the n-type carrier accumulation layer 2 in the diode region 20. As with the IGBT region 10, the n− type drift layer 1, the n-type carrier accumulation layer 2, and the n-type buffer layer 3 may be collectively referred to as a drift layer.

On the first main surface side of the n-type carrier accumulation layer 2, the p-type anode layer 25 is provided. The p-type anode layer 25 is provided between the n− type drift layer 1 and the first main surface. In the p-type anode layer 25, the concentration of the p-type impurity may be the same as that of the p-type base layer 15 in the IGBT region 10, and the p-type anode layer 25 and the p-type base layer 15 may be simultaneously formed. The p-type anode layer 25 and the p-type base layer 15 may be formed at the same depth in the direction toward the second main surface. The concentration of the p-type impurity in the p-type anode layer 25 may be set to be lower than the concentration of the p-type impurity in the p-type base layer 15 in the IGBT region 10, to thereby reduce the amount of electron holes that flow into the diode region 20 at the time of a diode operation. By reducing the amount of electron holes that flow in at the time of the diode operation, the recovery current at the time of the diode operation can be reduced.

On the first main surface side of the p-type anode layer 25, the p+ type contact layer 24 is provided. The concentration of the p-type impurity in the p+ type contact layer 24 may be the same as or different from the concentration of the p-type impurity in the p+ type contact layer 14 in the IGBT region 10. The p+ type contact layer 24 forms the first main surface of the semiconductor substrate. The p+ type contact layer 24 is a region in which the concentration of the p-type impurity is higher than that of the p-type anode layer 25. When the p+ type contact layer 24 and the p-type anode layer 25 need to be distinguished from each other, the p+ type contact layer 24 and the p-type anode layer 25 may be individually referred to. The p+ type contact layer 24 and the p-type anode layer 25 may be collectively referred to as a p-type anode layer.

In the diode region 20, the n+ type cathode layer 26 is provided on the second main surface side of the n-type buffer layer 3. The n+ type cathode layer 26 is provided between the n− type drift layer 1 and the second main surface. The n+ type cathode layer 26 is provided in a part or the entirety of the diode region 20. The n+ type cathode layer 26 forms the second main surface of the semiconductor substrate. Although not shown, as described above, a p-type impurity may be further selectively implanted in a region in which the n+ type cathode layer 26 is formed, and the p-type cathode layer may be provided by using a part of the region in which the n+ type cathode layer 26 is formed as a p-type semiconductor.

As illustrated in FIG. 7, in the diode region 20 of the semiconductor device 100 or the semiconductor device 101, trenches that pass through the p-type anode layer 25 from the first main surface of the semiconductor substrate and reach the n− type drift layer 1 are formed. The diode trench gates 21 are formed by providing the diode trench electrodes 21a in the trenches of the diode region 20 via the diode trench insulating films 21b. The diode trench electrodes 21a face the n− type drift layer 1 via the diode trench insulating films 21b.

As illustrated in FIG. 7, the barrier metal 5 is provided on the diode trench electrodes 21a and the p+ type contact layer 24. The barrier metal 5 is in ohmic contact with the diode trench electrodes 21a and the p+ type contact layer 24 and is electrically connected to the diode trench electrodes and the p+ type contact layer 24. The barrier metal 5 may have the same configuration as the barrier metal 5 in the IGBT region 10. The emitter electrode 6 is provided on the barrier metal 5. The emitter electrode 6 provided in the diode region 20 is formed to be continuous with the emitter electrode 6 provided in the IGBT region 10. As with the IGBT region 10, the diode trench electrodes 21a and the p+ type contact layer 24, and the emitter electrode 6 may be brought into ohmic contact with each other without providing the barrier metal 5.

In FIG. 7, a configuration in which the contact holes 19 are provided without providing the interlayer insulating film 4 on the diode trench electrodes 21a of the diode trenches 21 is illustrated, but the interlayer insulating film 4 may be formed on the diode trench electrodes 21a of the diode trenches 21. When the interlayer insulating film 4 is formed on the diode trench electrodes 21a of the diode trenches 21, the emitter electrode 6 and the diode trench electrodes 21a only need to be electrically connected to each other at a different cross section.

On the second main surface side of the n+ type cathode layer 26, the collector electrode 7 is provided. As with the emitter electrode 6, the collector electrode 7 in the diode region 20 is formed to be continuous with the collector electrode 7 provided in the IGBT region 10. The collector electrode 7 is in ohmic contact with the n+ type cathode layer 26 and is electrically connected to the n+ type cathode layer 26.

FIG. 8 is a cross-sectional view of the semiconductor device 100 or the semiconductor device 101 taken along broken line D-D in FIG. 6 and is a cross-sectional view of the diode region 20. FIG. 8 is different from the cross-sectional view taken along broken line C-C illustrated in FIG. 7 in that the p+ type contact layer 24 is not provided between the p-type anode layer 25 and the barrier metal 5 and that the p-type anode layer 25 forms the first main surface of the semiconductor substrate. In other words, the p+ type contact layer 24 illustrated in FIG. 7 is selectively provided on the first main surface side of the p-type anode layer 25.

Figure 9:
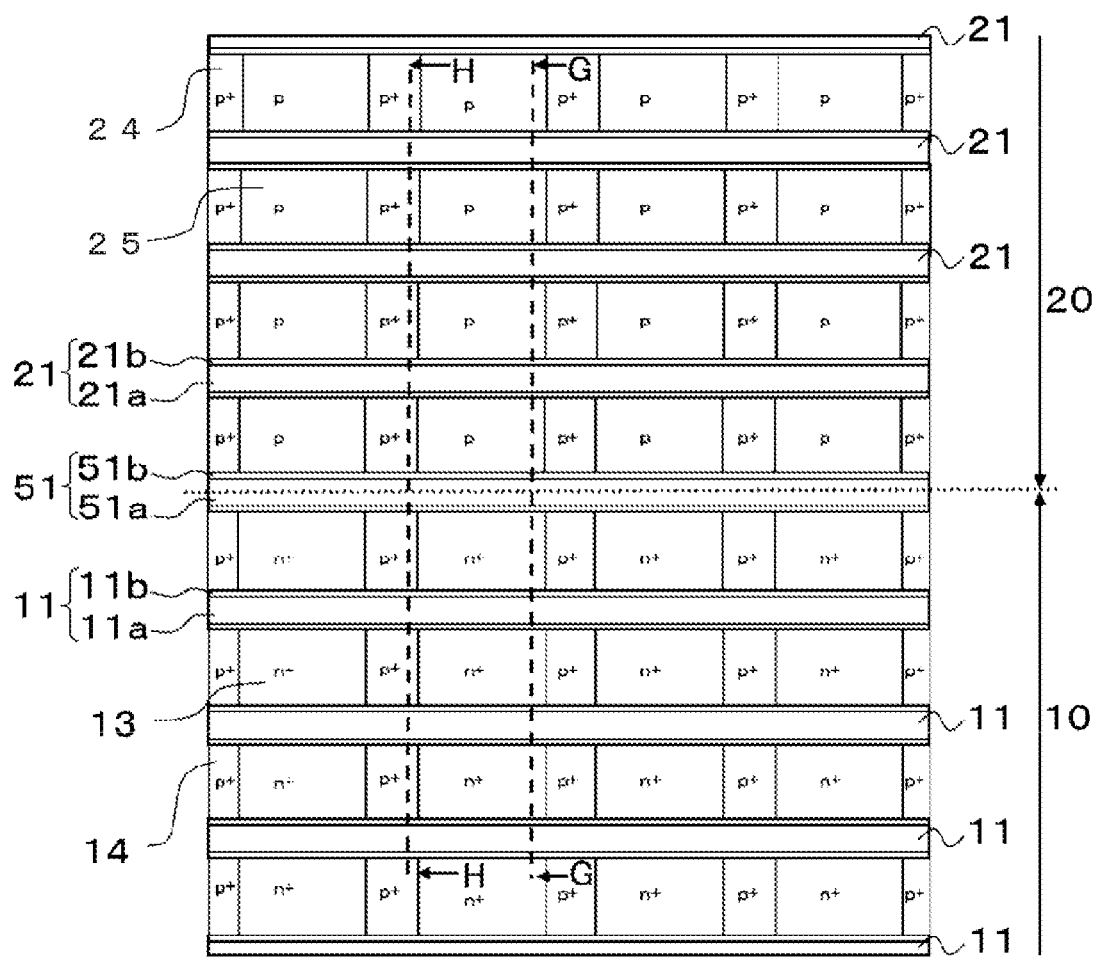
FIG. 9 is a partially-enlarged cross-sectional view illustrating the configuration of the boundary between the IGBT region and the diode region of the semiconductor device according to the first embodiment.

FIG. 9 is a partially-enlarged cross-sectional view illustrating the configuration of the boundary between the IGBT region and the diode region of the semiconductor device according to the first embodiment and illustrates the configuration of the boundary between the IGBT region and the diode region of the semiconductor device that is an RC-IGBT. FIG. 9 illustrates a region surrounded by a broken line 84 in the semiconductor device 100 illustrated in FIG. 1 or the semiconductor device 101 in an enlarged manner. As illustrated in FIG. 9, the IGBT region 10 and the diode region 20 are provided to be adjacent to each other, and a boundary trench gate 51 is provided between the active trench gate 11 in the IGBT region 10 and the dummy trench gate 21 in the diode region 20.

In the region surrounded by the broken line 84 in the semiconductor device 100, the boundary trench gate 51 extends in the paper left-right direction that is the longitudinal direction of the active trench gate 11 in the IGBT region 10 and the dummy trench gate 21 in the diode region 20, and the longitudinal direction of the active trench gate 11 in the IGBT region 10 and the dummy trench gate 21 in the diode region 20 is the longitudinal direction of the boundary trench gate 51. Meanwhile, in the region surrounded by the broken line 84 in the semiconductor device 101, the boundary trench gate 51 extends in the paper left-right direction that is the longitudinal direction of the active trench gate 11 in the IGBT region 10 and the dummy trench gate 21 in the diode region 20, and the longitudinal direction of the active trench gate 11 in the IGBT region 10 and the dummy trench gate 21 in the diode region 20 is the longitudinal direction of the boundary trench gate 51.

The boundary trench gate 51 has a boundary trench gate electrode 51a in a trench formed in the semiconductor substrate via a gate trench insulating film 51b. On one side of the boundary trench gate 51 in the width direction, in other words, the IGBT region 10 side, the n+ type source layers 13 are provided to be in contact with the gate trench insulating film 51b. On the other side of the boundary trench gate 51 in the width direction, in other words, the diode region 20 side, the p-type anode layers 25 are provided to be in contact with the gate trench insulating film 51b. In a place in the IGBT region 10 between the boundary trench gate 51 and the active trench gate 11, the n+ type source layers 13 are provided so as to alternate with the p+ type contact layers 14 along the extending direction of the boundary trench gate 51. In a place in the diode region 20 between the boundary trench gate 51 and the diode trench 21, the p-type anode layers 25 are provided so as to alternate with the p+ type contact layers 24 along the extending direction of the boundary trench gate 51.

Figure 10:
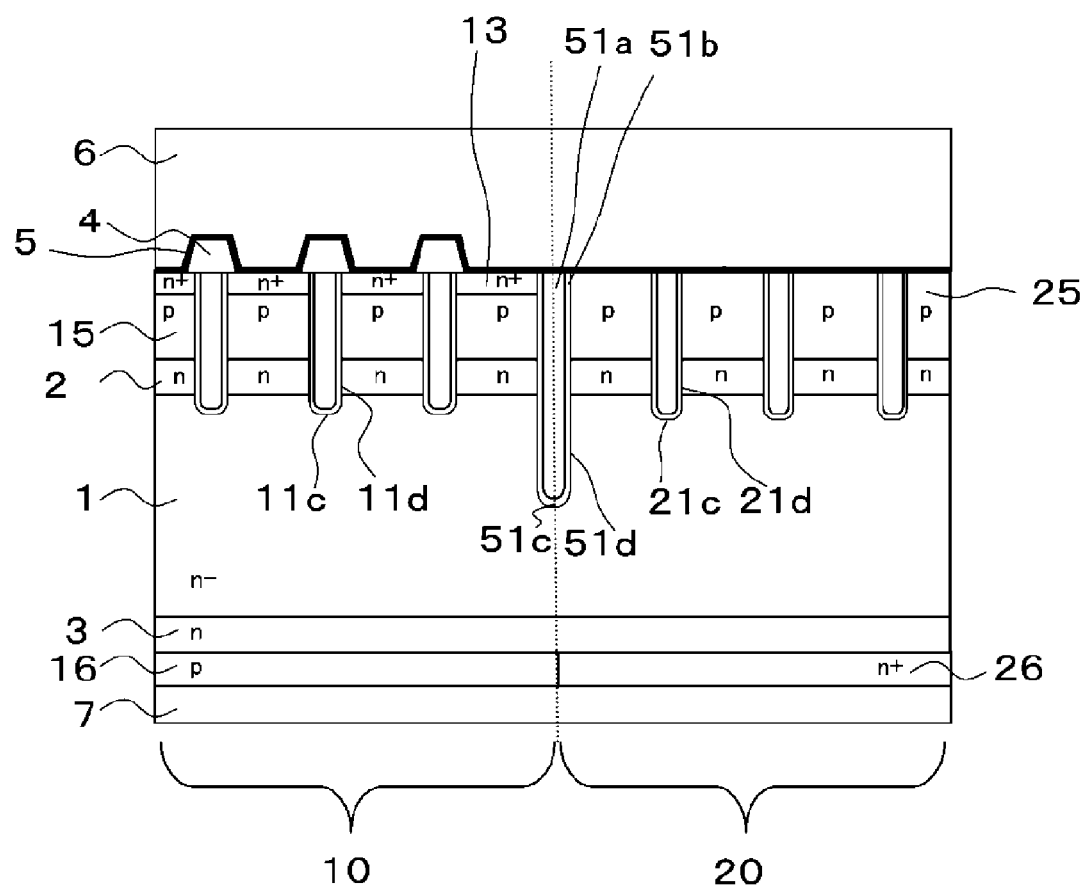
FIG. 10 and FIG. 11 are a cross-sectional views illustrating the configuration of the boundary between the IGBT region and the diode region of the semiconductor device according to the first embodiment.

FIG. 10 is a cross-sectional view illustrating the configuration of the boundary between the IGBT region and the diode region of the semiconductor device according to the first embodiment and illustrates a cross-sectional view taken along broken line G-G in FIG. 9. The boundary trench gate 51 has the boundary trench gate electrode 51a, the gate trench insulating film 51b, a bottom surface 51c, and a side wall 51d. The boundary trench of the boundary trench gate 51 has the bottom surface 51c of the boundary trench gate and the side wall 51d of the boundary trench gate. The side wall 51d of the boundary trench gate is formed so as to connect the bottom surface 51c and the first main surface to each other.

An active trench of the active trench gate 11 has a bottom surface 11c of the active trench gate and a side wall 11d of the active trench gate. The side wall 11d of the active trench gate is formed so as to connect the bottom surface 11c and the first main surface to each other. A dummy trench of the dummy trench gate 21 has a bottom surface 21c of the dummy trench gate and a side wall 21d of the dummy trench gate. The side wall 21d of the dummy trench gate is formed so as to connect the bottom surface 21c and the first main surface to each other.

As illustrated in FIG. 10, the boundary between the IGBT region 10 and the diode region 20 is a position in which the boundary trench gate 51 having the bottom surface 51c that is deeper than the bottom surfaces 11c of the active trench gates on the IGBT region 10 side and the bottom surfaces 21c of the dummy trench gates on the diode region 20 side is provided. The p-type collector layer 16 provided on the second main surface side of the IGBT region 10 is provided to be in contact with the n+ type cathode layer 26 at the boundary between the IGBT region 10 and the diode region 20. The p-type collector layer 16 and the n+ type cathode layer 26 have manufacturing errors, and hence only one or more sets of the p-type collector layer 16 and the n+ type cathode layer 26 in which a part of the p-type collector layer 16 and a part of the n+ type cathode layer 26 are in contact with each other at the boundary between the IGBT region 10 and the diode region 20 needs to be provided.

Figure 11:
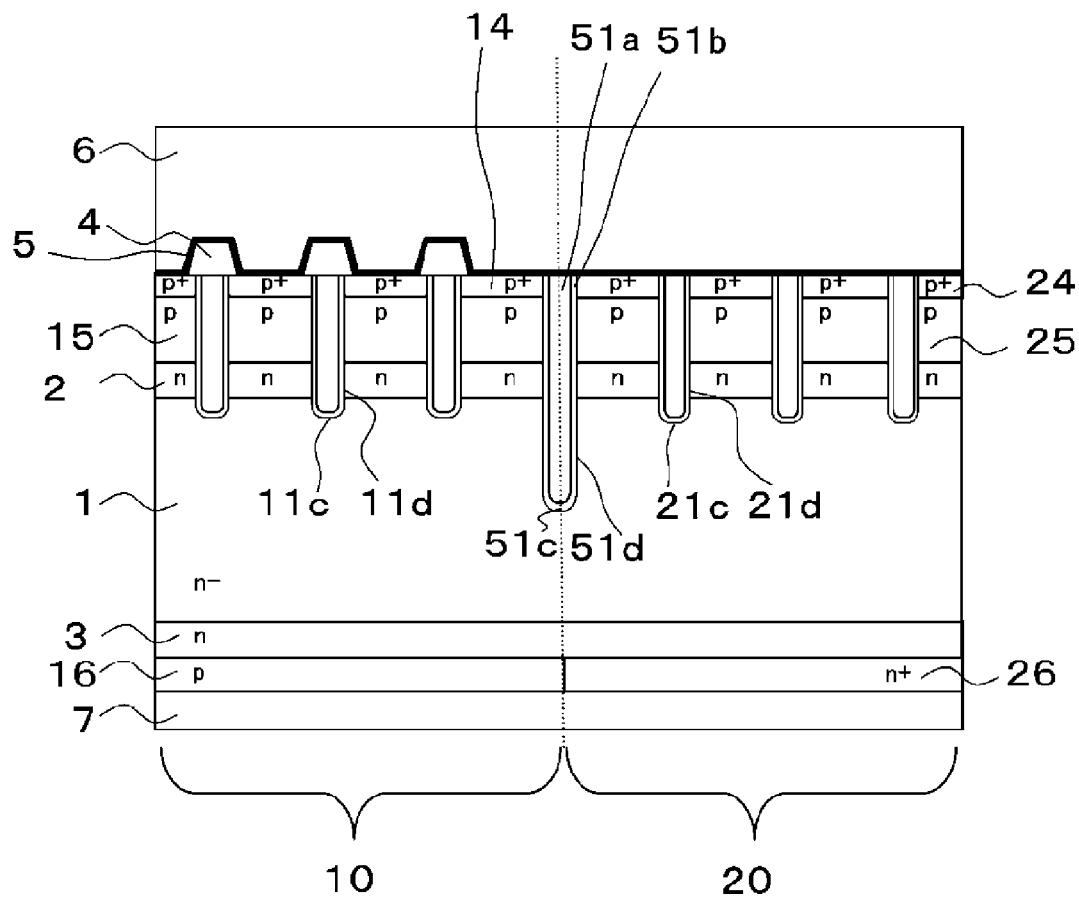

FIG. 11 is a cross-sectional view illustrating the configuration of the boundary between the IGBT region and the diode region of the semiconductor device according to the first embodiment and illustrates a cross-sectional view taken along broken line H-H in FIG. 9. FIG. 11 is different from the cross-sectional view taken along broken line G-G illustrated in FIG. 10 in that the n+ type source layer 13 provided on the first main surface side of the semiconductor substrate cannot be seen in the cross section taken along broken line H-H of FIG. 11 and is replaced with the p+ type contact layer 14 and that the p+ type contact layer 24 is provided between the p-type anode layer 25 and the barrier metal 5 and forms the first main surface of the semiconductor substrate.

Next, a manufacturing method of the semiconductor device according to the first embodiment is described. In the description of the manufacturing method below, the manufacturing method of the cell region is described, and the manufacturing methods of the terminal region 30, the pad region 40, and the like formed by freely-selected structures are omitted.

FIG. 12 to FIG. 17 illustrate the manufacturing method of the semiconductor device according to the first embodiment and illustrate the manufacturing method of the semiconductor device that is an RC-IGBT. FIG. 12 to FIG. 15 illustrate a step of forming the front surface side of the semiconductor device 100 or the semiconductor device 101, and FIG. 16 and FIG. 17 illustrate a step of forming the rear surface side of the semiconductor device 100 or the semiconductor device 101.

Figure 12A:
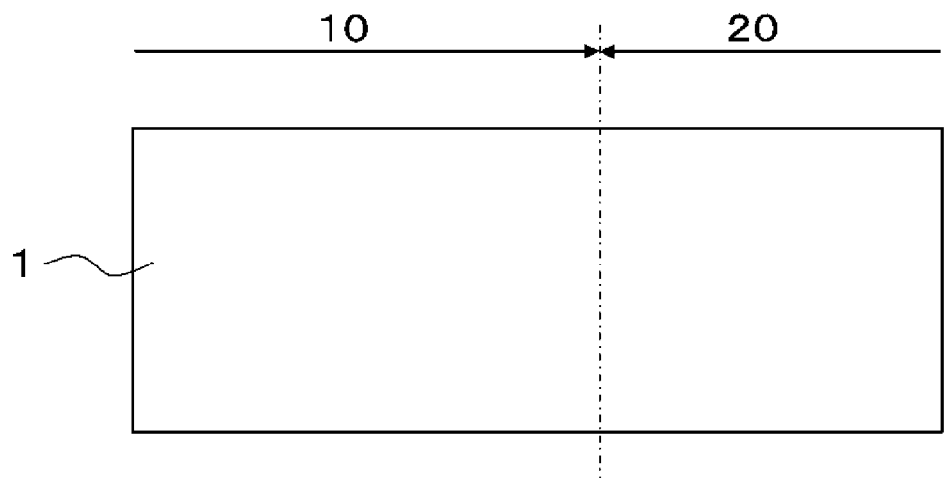
FIG. 12A to FIG. 17B illustrate the manufacturing method of the semiconductor device according to the first embodiment.

First, as illustrated in FIG. 12A, the semiconductor substrate forming the n− type drift layer 1 is prepared. For the semiconductor substrate, a so-called FZ wafer manufactured by a floating zone (FT) method and a so-called MCZ wafer manufactured by a magnetic applied CZochralki (MCZ) method may be used, for example, and the semiconductor substrate may be a n-type wafer containing an n-type impurity. The concentration of the n-type impurity contained in the semiconductor substrate is selected, as appropriate, in accordance with the withstand voltage of the manufactured semiconductor device. For example, in a semiconductor device of which withstand voltage is 1200 V, the concentration of the n-type impurity is adjusted so that the specific resistance of the n− type drift layer 1 forming the semiconductor substrate becomes from about 40 to 120 Ω·cm. As illustrated in FIG. 12A, in the step of preparing the semiconductor substrate, the entirety of the semiconductor substrate is the n− type drift layer 1, but the semiconductor device 100 or the semiconductor device 101 is manufactured by forming a p-type or an n-type semiconductor layer by implanting p-type or n-type impurity ions from the first main surface side or the second main surface side of the semiconductor substrate as above and then diffusing the p-type or n-type impurity ions in the semiconductor substrate by heat treatment and the like.

As illustrated in FIG. 12A, the semiconductor substrate forming the n− type drift layer 1 includes a region that serves as the IGBT region 10 and the diode region 20. Although not shown, a region that serves as the terminal region 30 is included around the region that serves as the IGBT region 10 and the diode region 20. The manufacturing method of the configuration of the IGBT region 10 and the diode region 20 of the semiconductor device 100 or the semiconductor device 101 is mainly described below, but the terminal region 30 of the semiconductor device 100 or the semiconductor device 101 may be manufactured by a well-known manufacturing method. For example, when an FLR having a p-type terminal well layer is formed in the terminal region 30 as the withstand voltage maintaining structure, the FLR may be formed by implanting p-type impurity ions before processing the IGBT region 10 and the diode region 20 of the semiconductor device 100 or the semiconductor device 101 or may be formed by simultaneously implanting p-type impurity ions when a p-type impurity is ion-implanted in the IGBT region 10 or the diode region 20 of the semiconductor device 100.

Figure 12B:
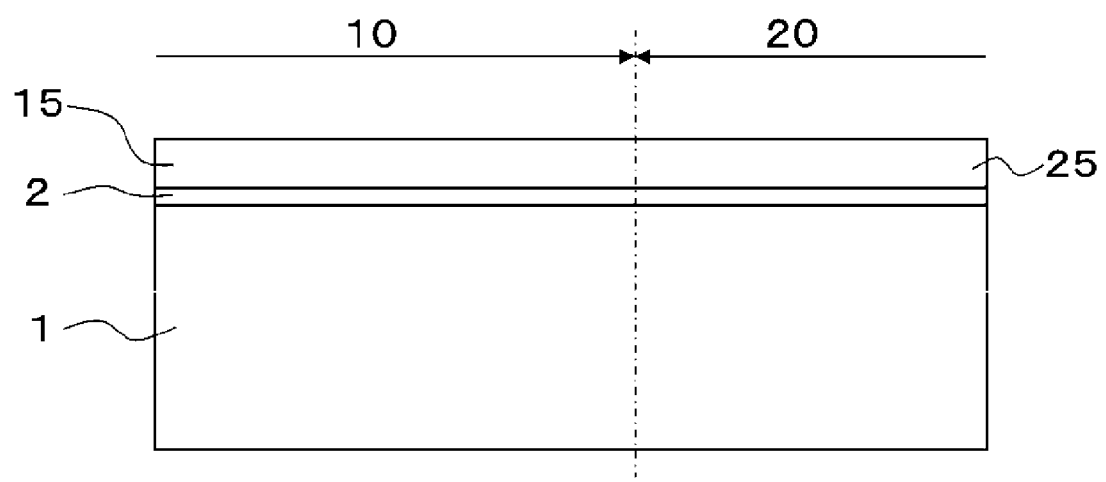

Next, as illustrated in FIG. 12B, the n-type carrier accumulation layer 2 is formed by implanting an n-type impurity such as phosphorus (P) from the first main surface side of the semiconductor substrate. The p-type base layer 15 and the p-type anode layer 25 are formed by implanting a p-type impurity such as boron (B) from the first main surface side of the semiconductor substrate. The n-type carrier accumulation layer 2, the p-type base layer 15, and the p-type anode layer 25 are formed by diffusing impurity ions by heat treatment after implanting the impurity ions in the semiconductor substrate. The n-type impurity and the p-type impurity are ion-implanted after a mask process is applied to the first main surface of the semiconductor substrate, and hence are selectively formed on the first main surface side of the semiconductor substrate. The n-type carrier accumulation layer 2, the p-type base layer 15, and the p-type anode layer 25 are formed in the IGBT region 10 and the diode region 20 and are connected to the p-type terminal well layer in the terminal region 30. The mask process refers to a process of forming a mask on the semiconductor substrate by applying a resist on the semiconductor substrate and forming openings in a predetermined region of the resist with use of photoengraving in order to perform etching and perform ion implanting in predetermined regions of the semiconductor substrate via the openings.

The p-type base layer 15 and the p-type anode layer 25 may be formed by simultaneously ion-implanting a p-type impurity therein. In this case, the depths and the p-type impurity concentrations of the p-type base layer 15 and the p-type anode layer 25 are the same, and the same configurations are obtained. By the configuration as above, ion implantation can be simultaneously performed, and hence the productivity of the semiconductor device can be improved. The depths of the p-type base layer 15 and the p-type anode layer 25 are the same, and hence the electric field concentration can be alleviated and the withstand voltage decrease can be suppressed. By separately ion-implanting a p-type impurity in the p-type base layer 15 and the p-type anode layer 25 by the mask process, the depths and the p-type impurity concentrations of the p-type base layer 15 and the p-type anode layer 25 may be caused to be different from each other.

Figure 13A:
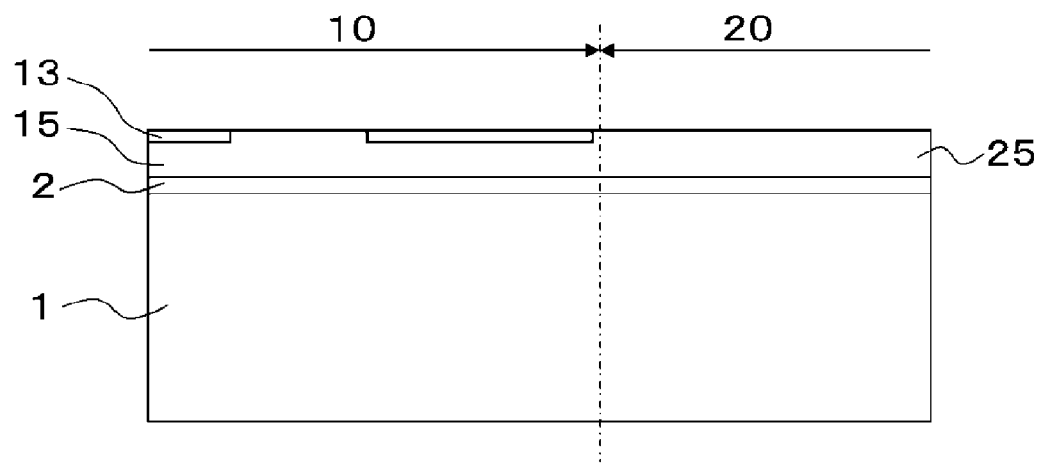

Next, as illustrated in FIG. 13A, the n+ type source layer 13 is formed by selectively implanting an n-type impurity on the first main surface side of the p-type base layer 15 in the IGBT region 10 by the mask process. The n-type impurity to be implanted may be arsenic (As) or phosphorus (P), for example.

Figure 13B:
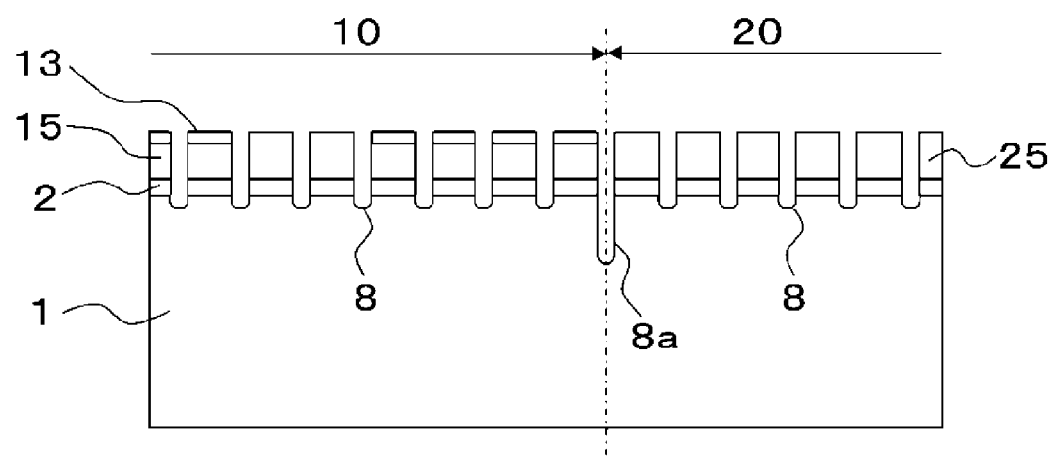

Next, as illustrated in FIG. 13B, trenches 8 that pass through the p-type base layer 15 and the p-type anode layer 25 from the first main surface side of the semiconductor substrate and reach the n− type drift layer 1 are formed. In the IGBT region 10, the side walls of the trenches 8 that pass through the n+ type source layer 13 form a part of the n+ type source layer 13. The trenches 8 may be formed by depositing an oxide film such as SiO2 on the semiconductor substrate, and then forming openings in parts of the oxide film in which the trenches 8 are to be formed by the mask process and etching the semiconductor substrate by using the oxide film in which the openings are formed as a mask. In FIG. 13B, the pitches between the trenches 8 are the same in the IGBT region 10 and the diode region 20, but the pitches between the trenches 8 may differ between the IGBT region 10 and the diode region 20. The pattern of the pitches between the trenches 8 in plan view can be changed, as appropriate, in accordance with the mask pattern of the mask process.

By the mask process, the trench pitch may be changed such that the interval between the plurality of dummy trench gates 21 in the diode region 20 is changed to be wider than the interval between the plurality of active trench gates 11 in the IGBT region 10, or the trench pitch may be changed such that the interval between the plurality of dummy trench gates 21 in the diode region 20 becomes narrower than the interval between the plurality of active trench gates 11 in the IGBT region 10.

As illustrated in FIG. 13B, a trench 8a positioned in the boundary between the IGBT region 10 and the diode region 20 can be a trench of which bottom surface is deeper than the trenches 8 in the IGBT region 10 and the diode region 20 by performing the etching two times. The trench 8a is a boundary trench that forms the boundary trench gate 51. A deep trench may be formed by one etching by causing the width of the trench 8a to be wide by the mask process. The etching rate at the time of the trench etching changes in accordance with the opening width of the trench. Therefore, a deep trench can be formed by changing the opening width in a direction in which the etching rate becomes faster for only the trench that is desired to be deeper. The pattern of the trench widths in plan view can be changed, as appropriate, in accordance with the mask pattern of the mask process. By extending the trench pitch as with the trench width, a deep trench can be partially formed without adding a step.

In the description below, the trench 8a that is the boundary trench and the other trenches 8 may not be distinguished from each other, and the description of the trenches 8 may include the trench 8a.

Figure 14A:
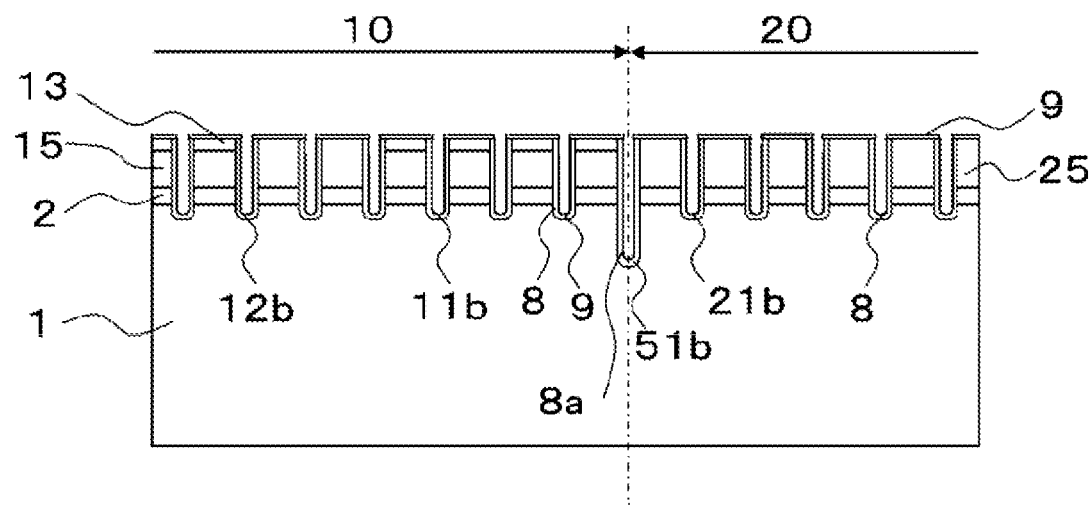

Next, as illustrated in FIG. 14A, the semiconductor substrate is heated in an atmosphere containing oxygen, to thereby form an oxide film 9 on inner walls of the trenches 8 and 8a and the first main surface of the semiconductor substrate. The inner walls of the trenches 8 and 8a have bottom surfaces and side walls, and are the bottom surface 51c and the side wall 51d of the trench 8a that is the boundary trench, the bottom surface 11c and the side wall 11d of the IGBT-side active trench, and the bottom surface 21c and the side wall 21d of the diode-side dummy trench, for example. Out of the oxide film 9 formed on the inner walls of the trenches 8 and 8a, the oxide film 9 formed in the trenches 8 in the IGBT region 10 serves as the gate trench insulating films 11b of the active trench gates 11 and the dummy trench insulating films 12b of the dummy trench gates 12. The oxide film 9 formed in the trenches 8 in the diode region 20 serves as the diode trench insulating films 21b. The oxide film 9 formed in the trench 8a that is the boundary trench serves as the boundary trench gate insulating film 51b of the boundary trench gate 51. The oxide film 9 formed on the first main surface of the semiconductor substrate is removed in a later step.

Figure 14B:
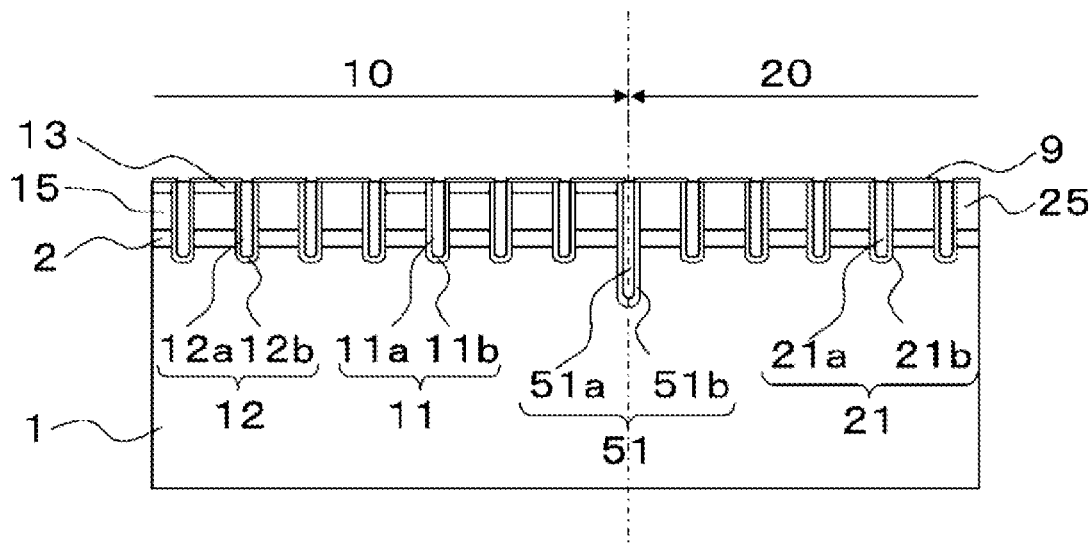

Next, as illustrated in FIG. 14B, polysilicon doped with an n-type or a p-type impurity is deposited by chemical vapor deposition (CVD) and the like in the trenches 8 and 8a having inner walls on which the oxide film 9 is formed, to thereby form the gate trench electrodes 11a, the dummy trench electrodes 12a, the diode trench electrodes 21a, and the boundary trench gate electrode 51a.

Figure 15A:
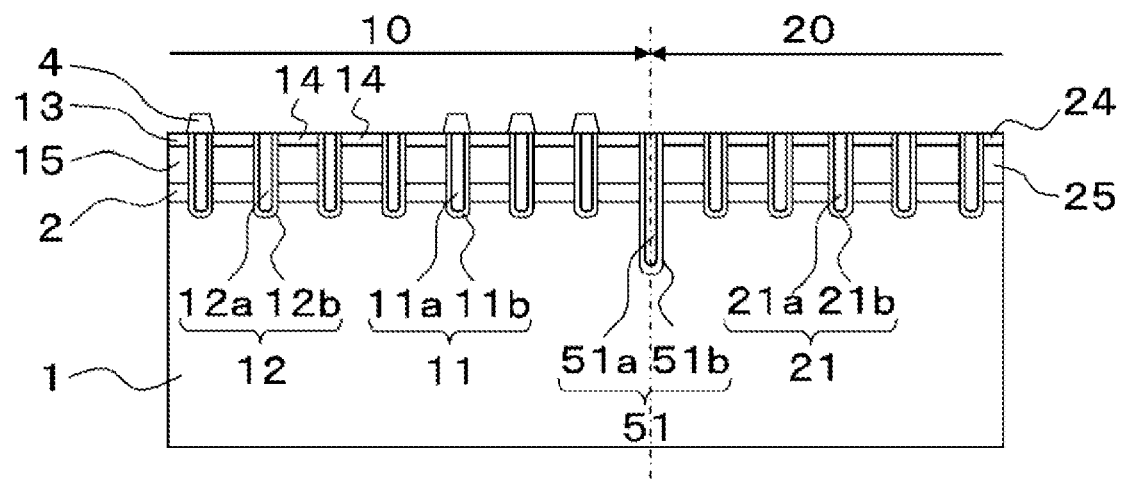

Next, as illustrated in FIG. 15A, after the interlayer insulating films 4 are formed on the gate trench electrodes 11a of the active trench gates 11 in the IGBT region 10, the oxide film 9 formed on the first main surface of the semiconductor substrate is removed. The interlayer insulating film 4 may be SiO2, for example. Then, contact holes are formed in the deposited interlayer insulating film 4 by the mask process. The contact holes are formed on the n+ type source layers 13, the p+ type contact layer 14, the p+ type contact layers 24, the dummy trench electrodes 12a, the diode trench electrodes 21a, and the boundary trench gate electrode 51a.

Figure 15B:
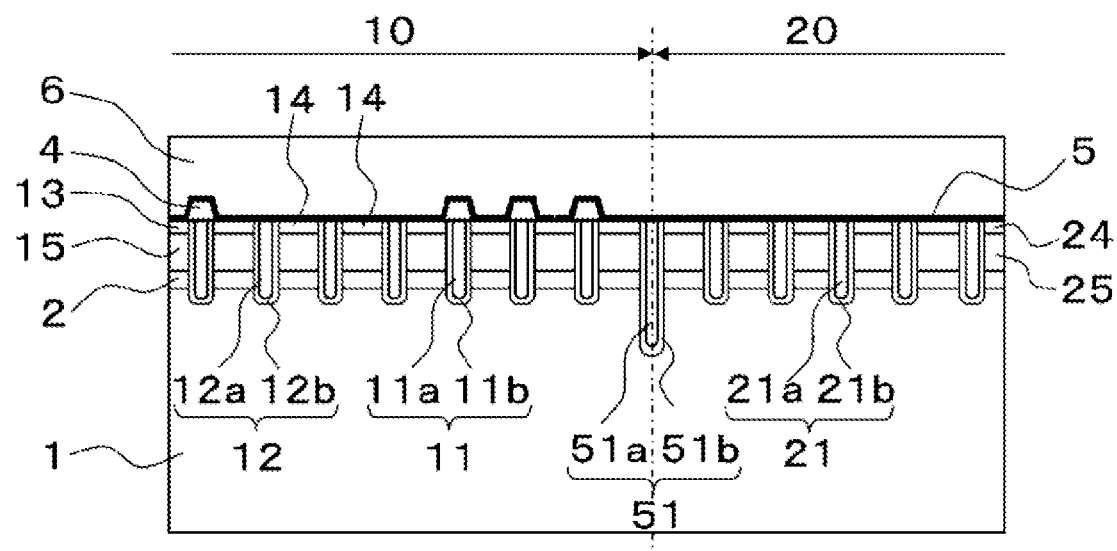

Next, as illustrated in FIG. 15B, the barrier metal 5 is formed on the interlayer insulating film 4 and the first main surface of the semiconductor substrate, and the emitter electrode 6 is further formed on the barrier metal 5. The barrier metal 5 is formed by producing a film of titanium nitride by physical vapor deposition (PVD) or CVD.

The emitter electrode 6 may be formed by depositing an aluminum-silicon alloy (Al—Si alloy) on the barrier metal S by PVD such as sputtering and vapor deposition, for example. The emitter electrode 6 may be obtained by further forming a nickel alloy (Ni alloy) on the formed aluminum-silicon alloy by electroless plating or electroplating. When the emitter electrode 6 is formed by plating, a thick metal film can be easily formed as the emitter electrode 6. Therefore, the heat capacity of the emitter electrode 6 can be increased and the heat resistance thereof can be improved. When a nickel alloy is further formed by the plating process after forming the emitter electrode 6 formed by an aluminum-silicon alloy by PVD, the plating process for forming the nickel alloy may be performed after performing the processing of the second main surface side of the semiconductor substrate.

Figure 16A:
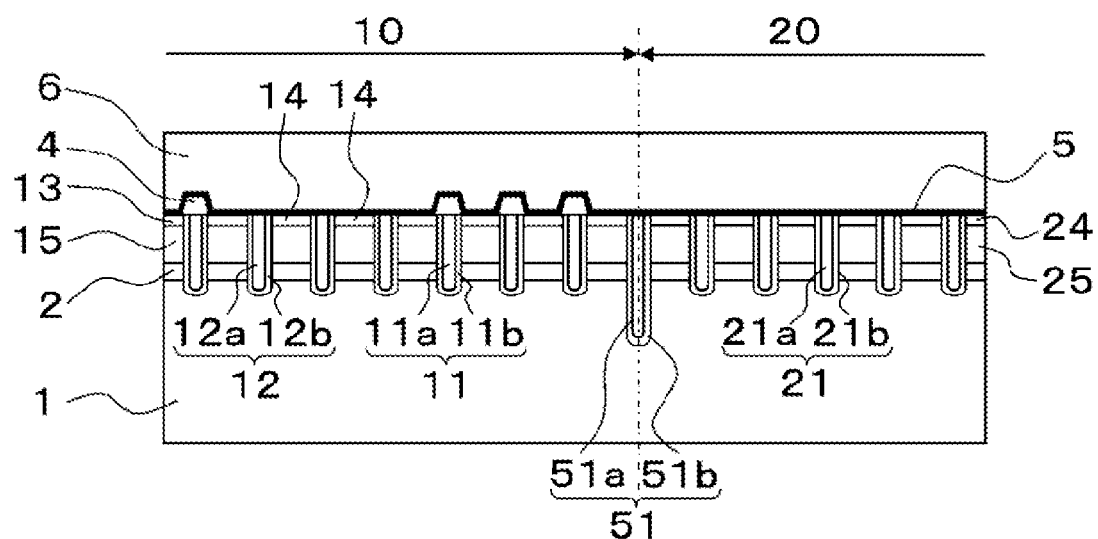

Next, as illustrated in FIG. 16A, the second main surface side of the semiconductor substrate is grinded, and the semiconductor substrate is thinned to a predetermined designed thickness. The thickness of the semiconductor substrate after the grinding may be from 80 to 200 μm, for example.

Figure 16B:
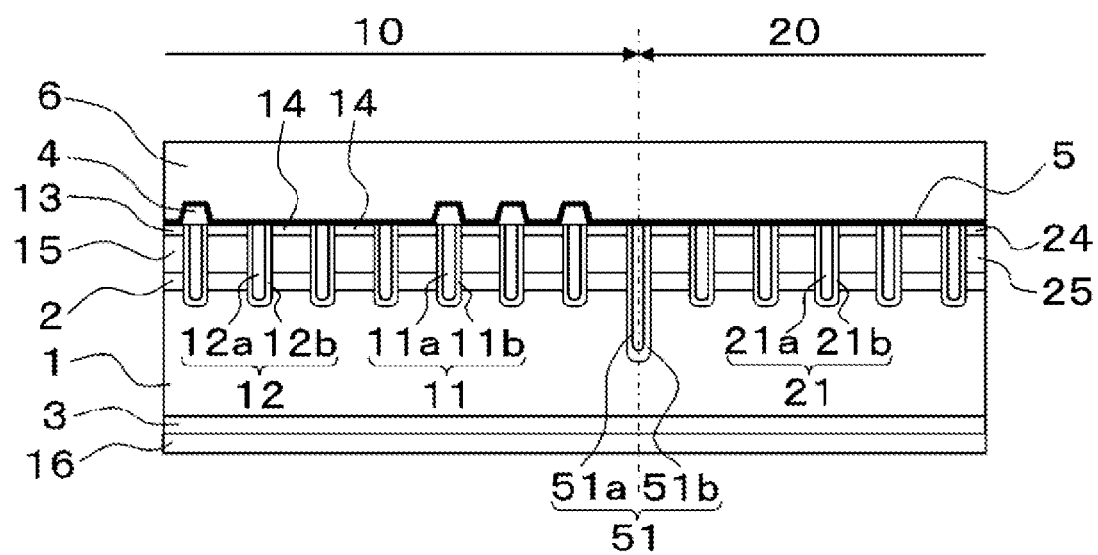

Next, as illustrated in FIG. 16B, the n-type buffer layer 3 is formed by implanting an n-type impurity from the second main surface side of the semiconductor substrate. The p-type collector layer 16 is further formed by implanting a p-type impurity from the second main surface side of the semiconductor substrate. The n-type buffer layer 3 may be formed in the IGBT region 10, the diode region 20, and the terminal region 30, or may be formed in only the IGBT region 10 or the diode region 20.

The n-type buffer layer 3 may be formed by implanting phosphorus (P) ions, for example. The n-type buffer layer 3 may be formed by implanting protons (H+). The n-type buffer layer 3 may be further formed by implanting both of protons and phosphorus. Protons can be implanted into a position that is deep from the second main surface of the semiconductor substrate with a relatively low acceleration energy. By changing the acceleration energy, the depth at which the protons are implanted can be relatively easily changed. Therefore, when the n-type buffer layer 3 is formed by protons, the n-type buffer layer 3 that is wider in the thickness direction of the semiconductor substrate as compared to a case where the n-type buffer layer 3 is formed by phosphorus can be formed by performing the implantation a plurality of times while changing the acceleration energy.

The activation rate of phosphorus as the n-type impurity can be higher than that of protons. Therefore, the punch-through of the depletion layer can be suppressed more reliably even for the semiconductor substrate that is thinned by forming the n-type buffer layer 3 by phosphorus. In order to thin the semiconductor substrate even more, it is preferred that the n-type buffer layer 3 be formed by implanting both of protons and phosphorus. In this case, protons are implanted into a position that is deeper from the second main surface than phosphorus.

The p-type collector layer 16 may be formed by implanting boron (B), for example. The p-type collector layer 16 is also formed in the terminal region 30, and the p-type collector layer 16 in the terminal region 30 serves as the p-type terminal collector layer. By performing laser annealing by irradiating the second main surface with a laser beam after the ion-implantation from the second main surface side of the semiconductor substrate is performed, the implanted boron is activated and the p-type collector layer 16 is formed. At this time, phosphorus for the n-type buffer layer 3 that is implanted at a position that is relatively shallow from the second main surface of the semiconductor substrate is simultaneously activated. Meanwhile, protons are activated at a relatively low annealing temperature such as a temperature of from 380° C. to 420° C. Therefore, there is a need to pay attention such that the entire semiconductor substrate does not reach a temperature that is higher than a temperature of from 380° C. to 420° C. in a step other than the step for activating protons after the protons are implanted. It is possible to increase only the temperature of a place near the second main surface of the semiconductor substrate to a high temperature by the laser annealing, and hence the laser annealing can be used for activating the n-type impurity and the p-type impurity even after protons are implanted.

Figure 17A:
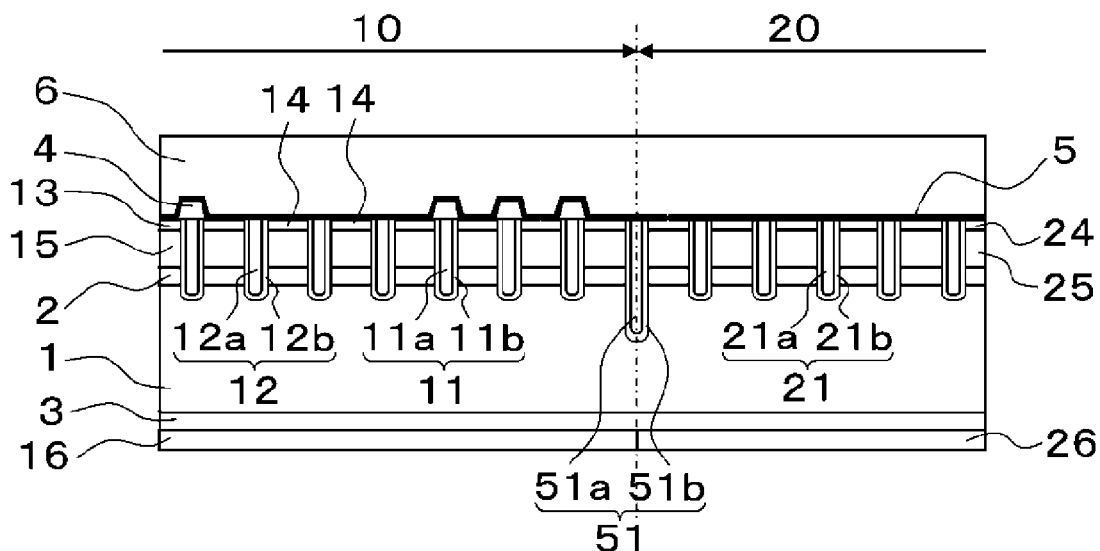

Next, as illustrated in FIG. 17A, the n+ type cathode layer 26 is formed on the diode region 20. The n+ type cathode layer 26 may be formed by implanting phosphorus (P), for example. As illustrated in FIG. 17A, phosphorus is selectively implanted from the second main surface side by the mask process such that the boundary between the p-type collector layer 16 and the n+ type cathode layer 26 is positioned in the position of the boundary between the IGBT region 10 and the diode region 20. The implantation amount of the n-type impurity for forming the n+ type cathode layer 26 may be more than the implantation amount of the p-type impurity for forming the p-type collector layer 16. In FIG. 17A, the depths of the p-type collector layer 16 and the n+ type cathode layer 26 from the second main surface are illustrated to be the same, but the depth of the n+ type cathode layer 26 may be equal to or more than the depth of the p-type collector layer 16. The region in which the n+ type cathode layer 26 is formed needs to become the n-type semiconductor by implanting an n-type impurity in the region in which a p-type impurity is implanted, and hence the concentration of the implanted p-type impurity is caused to be higher than the concentration of the n-type impurity in all of the regions in which the n+ type cathode layer 26 is formed.

Figure 17B:
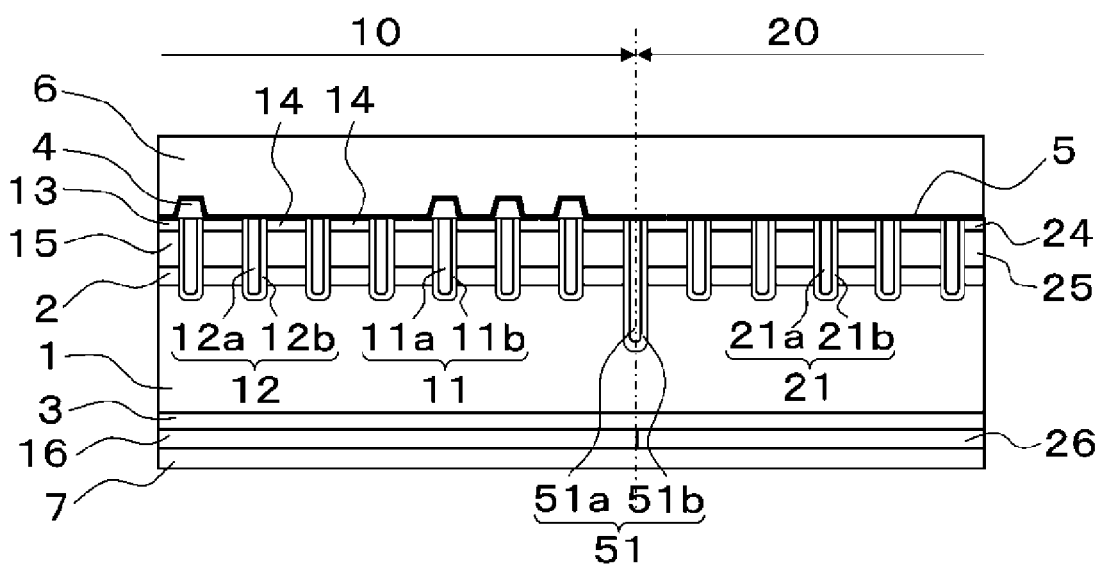

Next, as illustrated in FIG. 17B, the collector electrode 7 is formed on the second main surface of the semiconductor substrate. The collector electrode 7 is formed across the entire surface of the IGBT region 10, the diode region 20, and the terminal region 30 of the second main surface. The collector electrode 7 may be formed across the entire surface of the second main surface of the n-type wafer that is the semiconductor substrate. The collector electrode 7 may be formed by depositing an aluminum-silicon alloy (Al—Si alloy), titanium (Ti), and the like by PVD such as sputtering and vapor deposition, or may be formed by laminating a plurality of metal such as an aluminum-silicon alloy, titanium, nickel, or gold. The collector electrode 7 may be obtained by further forming a metal film by electroless plating or electroplating on a metal film formed by PVD.

The semiconductor device 100 or the semiconductor device 101 is manufactured by the steps as above. A plurality of the semiconductor devices 100 or the semiconductor devices 101 are manufactured in a matrix form in one n-type wafer, and hence the semiconductor devices 100 or the semiconductor devices 101 are completed by cutting and dividing the n-type wafer into the individual semiconductor devices 100 or semiconductor devices 101 by laser dicing or blade dicing.

Next, the operation of the semiconductor device according to the first embodiment is described.

Figure 18:
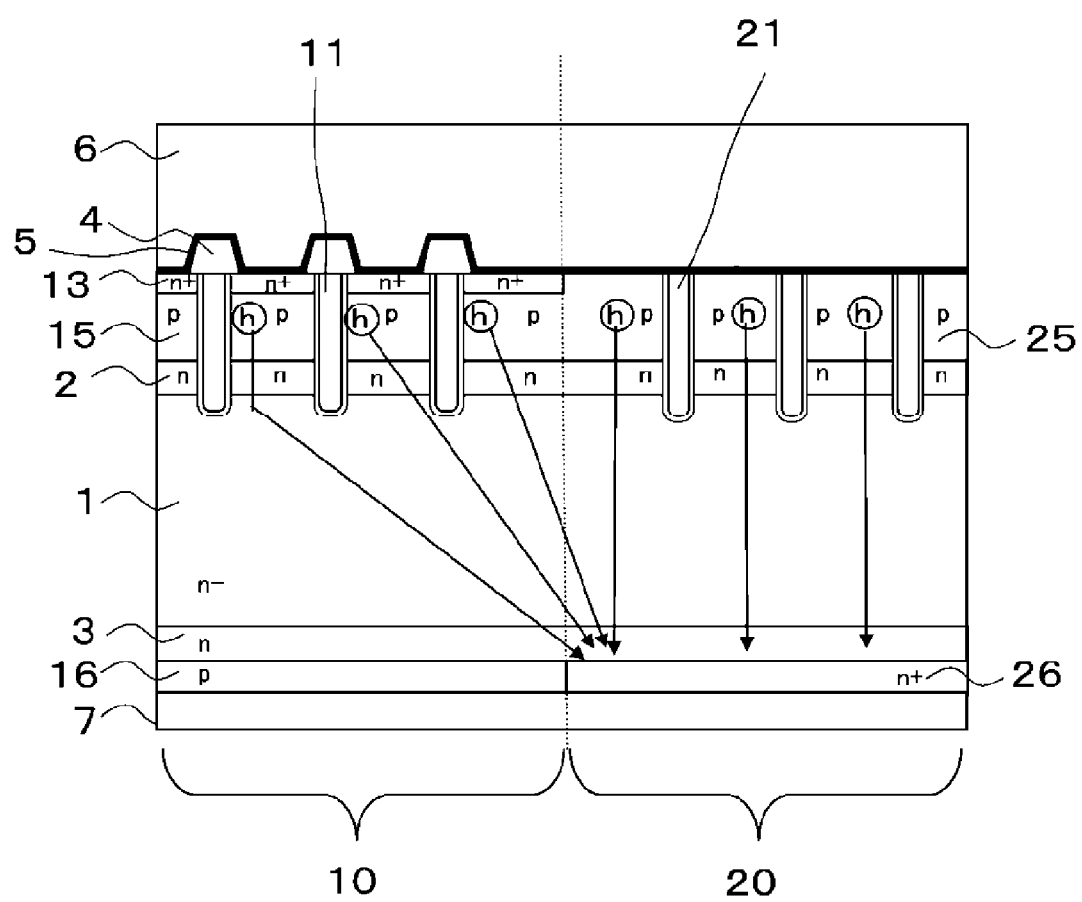
FIG. 18 schematically illustrates the movement of electron holes at the time of the diode operation of the semiconductor device of the comparative example.

First, a semiconductor device of a comparative example is described. Then, the semiconductor device according to the first embodiment is described. FIG. 18 schematically illustrates the movement of electron holes at the time of the diode operation of the semiconductor device of the comparative example. The semiconductor device of the comparative example is different from the semiconductor device 100 or the semiconductor device 101 of the first embodiment in that a boundary trench gate having a bottom surface that is deeper than the bottom surfaces of the active trench gates 11 on the IGBT region 10 side and the bottom surfaces of the dummy trench gates 21 on the diode region 20 side is not provided in the semiconductor device of the comparative example.

The diode operation of the semiconductor device of the comparative example is described. At the time of the diode operation, a positive voltage as compared to the collector electrode 7 is applied to the emitter electrode 6. When the positive voltage is applied, electron holes h flow into the drift layer 1 from the anode layer 25 and the base layer 15, and the electron holes h that flows in move toward the cathode layer 26. In addition to the electron holes h from the anode layer 25, the electron holes h from the IGBT region 10 also flow into the diode region 20 near the boundary with the IGBT region 10. As a result, the diode region 20 near the boundary with the IGBT region 10 is in a state in which the density of the electron holes h is higher than the diode region 20 far from the IGBT region 10. At the time of the diode operation, a reflux current flows in a direction toward the collector electrode 7 from the emitter electrode 6.

Figure 19:
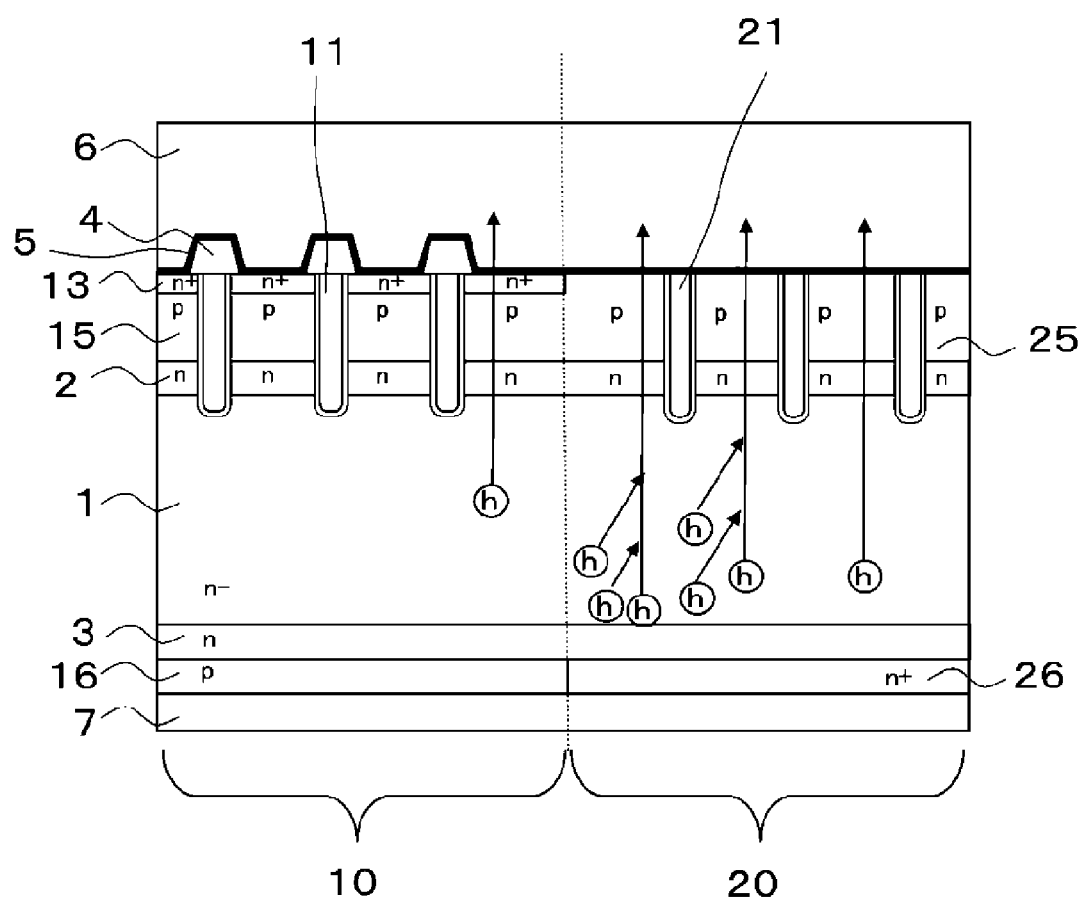
FIG. 19 schematically illustrates the movement of the electron holes at the time of the recovery operation of the semiconductor device of the comparative example.

A recovery operation of the semiconductor device of the comparative example is described. FIG. 19 schematically illustrates the movement of the electron holes at the time of the recovery operation of the semiconductor device of the comparative example. At the time of the recovery operation, a negative voltage as compared to the collector electrode 7 is applied to the emitter electrode 6. The electron holes h that have moved toward the cathode layer 26 at the time of the diode operation move while changing the direction of movement to the direction toward the anode layer 25. At the time of the recovery operation, the electron holes h flow out to the outside of the semiconductor device via the anode layer 25 and the emitter electrode 6.

As compared to the anode layer 25 in the diode region 20 far from the IGBT region 10, a larger number of electron holes h pass through the anode layer 25 in the diode region 20 near the boundary with the IGBT region 10 at which the density of the electron holes h is high at the time of the diode operation. Some of the electron holes h that exist in the IGBT region 10 flow out to the outside of the semiconductor device via the base layer 15 and the emitter electrode 6. At the time of the recovery operation, the recovery current flows in a direction toward the emitter electrode 6 from the collector electrode 7.

Figure 20:
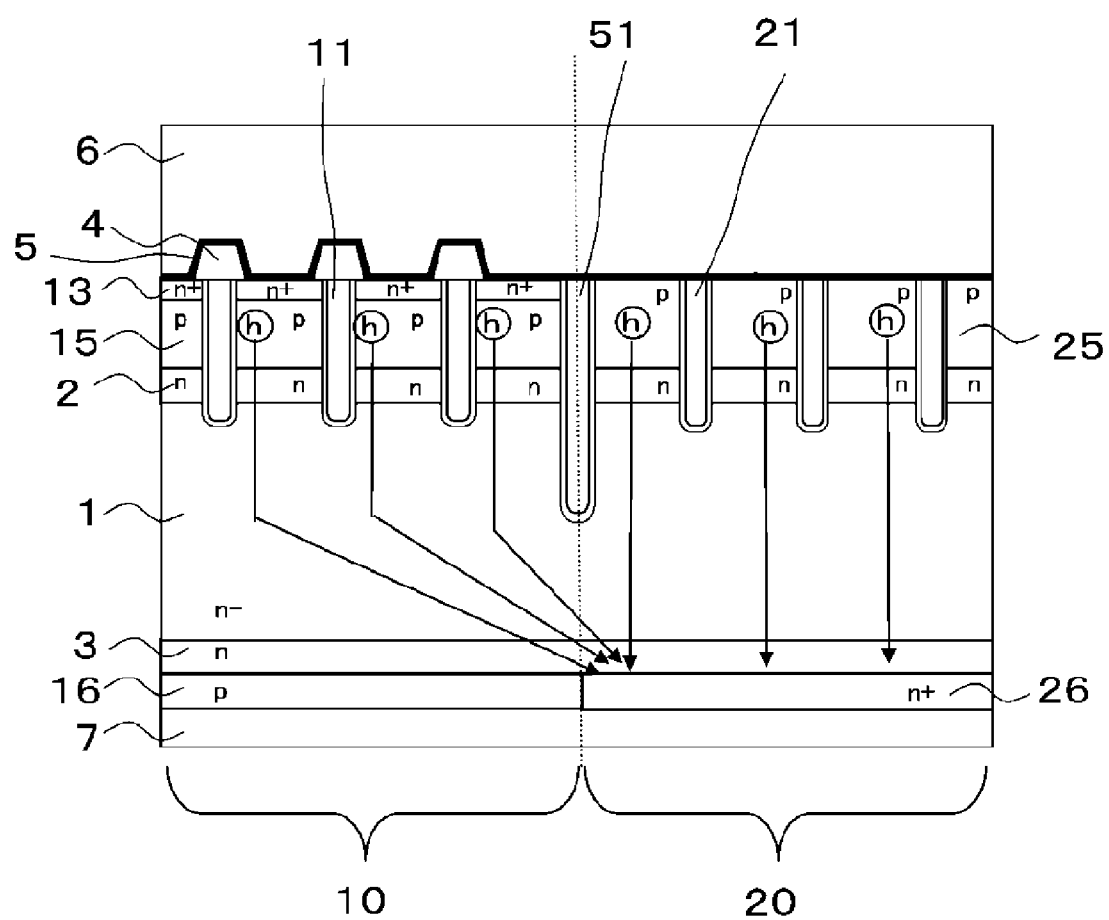
FIG. 20 and FIG. 21 schematically illustrate an effect of suppressing the flow-in of the electron holes of the semiconductor device according to the first embodiment
Figure 21:
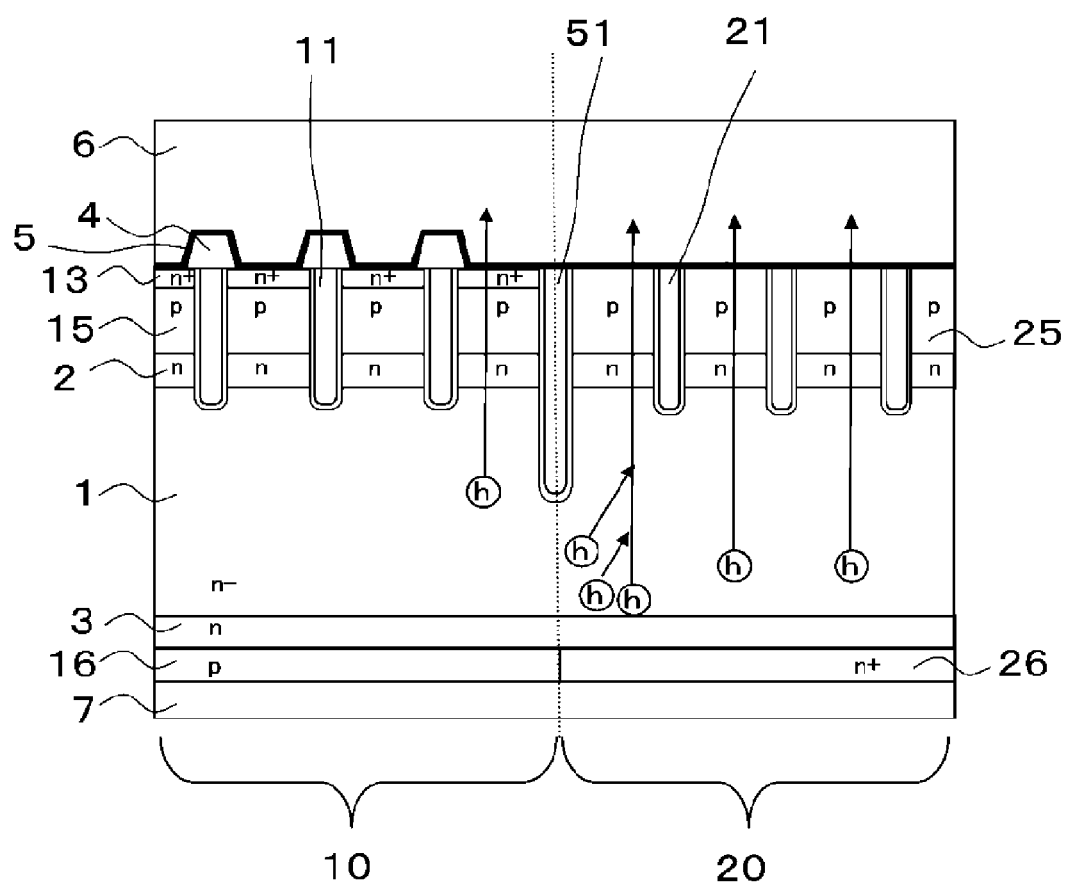

Next, the operation of the semiconductor device according to the first embodiment is described with reference to FIG. 20 and FIG. 21. FIG. 20 schematically illustrates an effect of suppressing the flow-in of the electron holes of the semiconductor device according to the first embodiment and schematically illustrates the movement of the electron holes at the time of the diode operation. FIG. 21 schematically illustrates the effect of suppressing the flow-in of the electron holes of the semiconductor device according to the first embodiment and schematically illustrates the movement of the electron holes the time of the recovery operation.

The semiconductor device according to the first embodiment suppresses the electron holes h that flow into the diode region 20 from the IGBT region 10. As illustrated in FIG. 20, the electron holes h flow into the drift layer 1 in the diode region 20 from the p-type base layer 15 at the time of the diode operation. At this time, by providing the boundary trench gate 51 having a bottom surface that is deeper than the bottom surfaces of the active trench gates 11 on the IGBT region 10 side and the bottom surfaces of the dummy trench gates 21 on the diode region 20 side at the boundary between the IGBT region 10 and the diode region 20, the moving route of the electron holes h from the p-type base layer 15 to the diode region 20 becomes longer, and the flow-in of the electron holes h can be suppressed.

Therefore, as illustrated in FIG. 21, at the time of the recovery operation, the recovery current can be suppressed and the breakdown resistance at the time of the recovery operation can be improved as compared to the semiconductor device of the comparative example in which the boundary trench gate 51 having a bottom surface that is deeper than the bottom surfaces of the active trench gates 11 on the IGBT region 10 side and the bottom surfaces of the dummy trench gates 21 on the diode region 20 side is not provided at the boundary between the IGBT region 10 and the diode region 20.

In the semiconductor device according to the first embodiment, the bottom surface 51c of the boundary trench gate has a bottom surface in a deeper position than the bottom surfaces 11c of the active trench gates on the IGBT region 10 side or the bottom surfaces 21c of the dummy trench gates on the diode region 20 side. By the configuration as above, the flow-in of the electron holes from the IGBT region 10 to the diode region 20 can be suppressed and the recovery current of a diode can be reduced without providing an invalid region between the IGBT region 10 and the diode region 20.

The boundary trench gate electrode 51a of the boundary trench gate 51 may be electrically connected to the gate pad 41c or may be electrically connected to the emitter electrode provided on the first main surface of the semiconductor device 100 or the semiconductor device 101.

Second Embodiment

Figure 22:
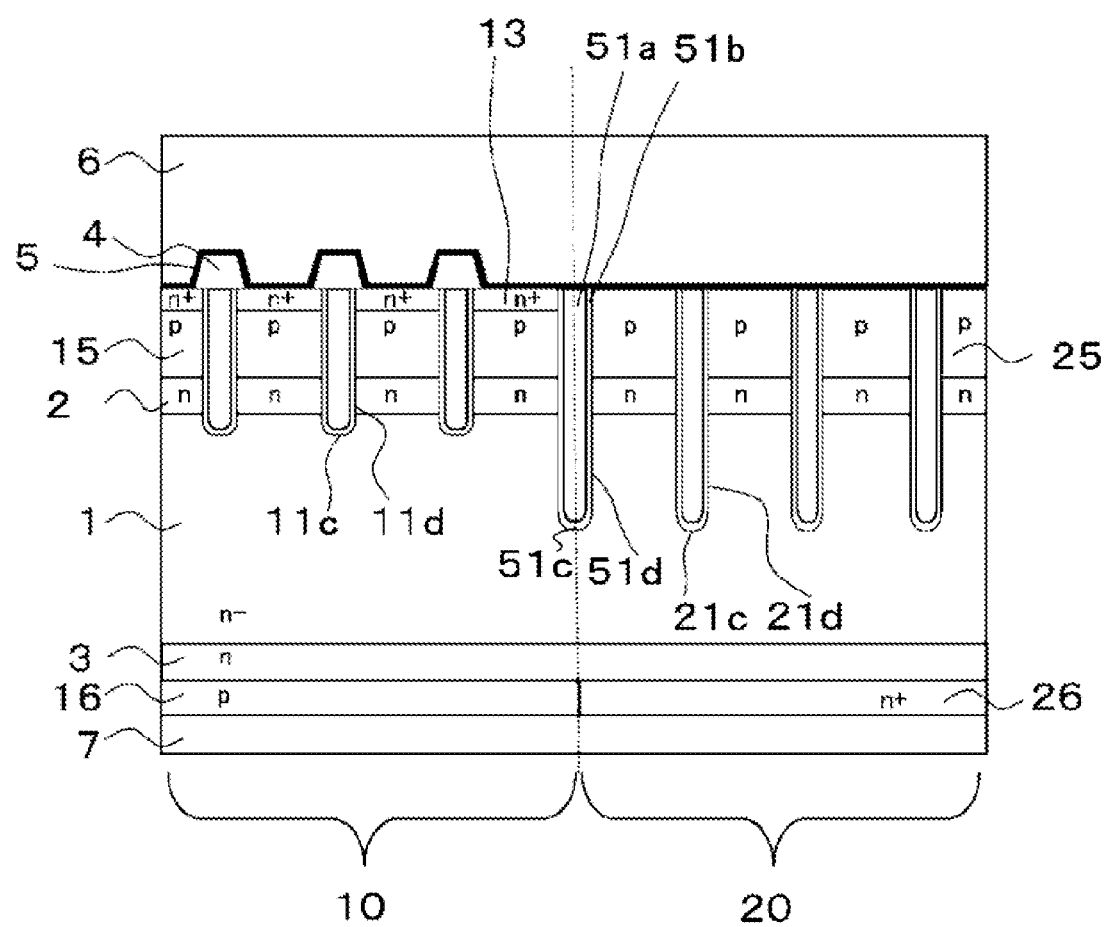
FIG. 22 is a cross-sectional view illustrating the semiconductor device according to the second embodiment.

The configuration of a semiconductor device according to a second embodiment is described with reference to FIG. 22. FIG. 22 is a cross-sectional view illustrating the semiconductor device according to the second embodiment. In the second embodiment, the same components as those described in the first embodiment are denoted by the same reference characters and description thereof is omitted.

As illustrated in FIG. 22, the bottom surface 51c of the boundary trench gate and the bottom surfaces 21c of the dummy trench gates on the diode region 20 side are positioned at the same depth, and the bottom surface 51c of the boundary trench gate and the bottom surfaces 21c of the dummy trench gates on the diode region 20 side are deeper than the bottom surfaces 11c of the active trench gates on the IGBT region 10 side. By the configuration as above, the electric field concentration in the drift layer near the bottom surfaces 21c of the dummy trench gates on the diode region 20 side can be alleviated and the withstand voltage decrease can be suppressed.

Therefore, in the second embodiment, because the bottom surface 51c of the boundary trench gate and the bottom surfaces 21c of the dummy trench gates on the diode side are positioned at the same depth and the bottom surface 51c of the boundary trench gate and the bottom surfaces 21c of the dummy trench gates on the diode side are deeper than the bottom surfaces 11c of the active trench gates on the IGBT side, the electric field concentration can be alleviated and the withstand voltage decrease can be suppressed while suppressing the recovery current and improving the breakdown resistance at the time of the recovery operation.

The trench width of the boundary trench gate 51 and the trench widths of the dummy trench gates 21 on the diode side may be wider than the trench widths of the active trench gates 11 on the IGBT side. By the configuration as described above, deep trenches can be partially formed without adding a step.

Third Embodiment

Figure 23:
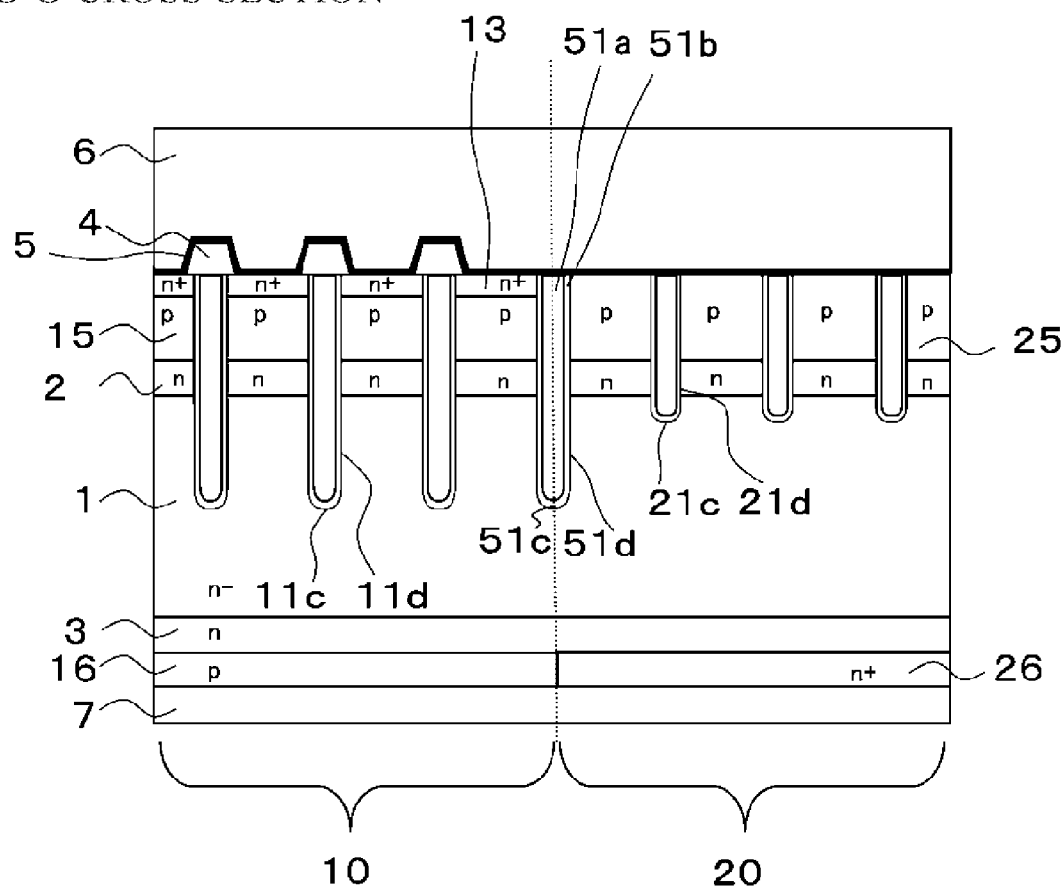
FIG. 23 is a cross-sectional view illustrating the semiconductor device according to the third embodiment.

The configuration of a semiconductor device according to the third embodiment is described with reference to FIG. 23. FIG. 23 is a cross-sectional view illustrating the semiconductor device according to the third embodiment. In the third embodiment, the same components as those described in the first embodiment and the second embodiment are denoted by the same reference characters and description thereof is omitted.

As illustrated in FIG. 23, the bottom surface 51c of the boundary trench gate is positioned at the same depth as the bottom surfaces 11c of the active trench gates on the IGBT region 10 side, and the bottom surface 51c of the boundary trench gate and the bottom surfaces 11c of the active trench gates on the IGBT region 10 side are deeper than the bottom surfaces 21c of the dummy trench gates on the diode region 20 side. By the configuration as above, the electric field concentration in the drift layer near the bottom surfaces 11c of the active trench gates on the IGBT region 10 side can be alleviated and the withstand voltage decrease can be suppressed. The bottom surface 51c of the boundary trench gate and the bottom surfaces 11c of the active trench gates on the IGBT region 10 side are positioned at the same depth. Therefore, while the flow-in of the electron holes h from the p-type base layer 15 to the diode region 20 can be suppressed more, the electron holes h can be accumulated in the drift layer 1 on the IGBT region 10 side. As a result, the injection enhancement (IE) effect can be increased, and the on-voltage can be reduced.

Therefore, in the third embodiment, the bottom surface 51c of the boundary trench gate and the bottom surfaces 11c of the active trench gates on the IGBT region 10 side are positioned at the same depth, and the bottom surface 51c of the boundary trench gate and the bottom surfaces 11c of the active trench gates on the IGBT region 10 side are deeper than the bottom surfaces 21c of the dummy trench gates on the diode region 20 side. As a result, the electric field concentration can be alleviated and the withstand voltage decrease can be suppressed while suppressing the recovery current and improving the breakdown resistance at the time of the recovery operation. The bottom surface 51c of the boundary trench gate and the bottom surfaces 11c of the active trench gates on the IGBT region 10 side are positioned at the same depth. Therefore, the injection enhancement (IE) effect can he increased, and the on-voltage can be reduced.

The trench width of the boundary trench gate 51 and the trench widths of the active trench gates 11 on the IGBT side be wider than the trench widths of the dummy trench gates 21 on the diode side. By the configuration as described above, deep trenches can be partially formed without adding a step.

Fourth Embodiment

Figure 24:
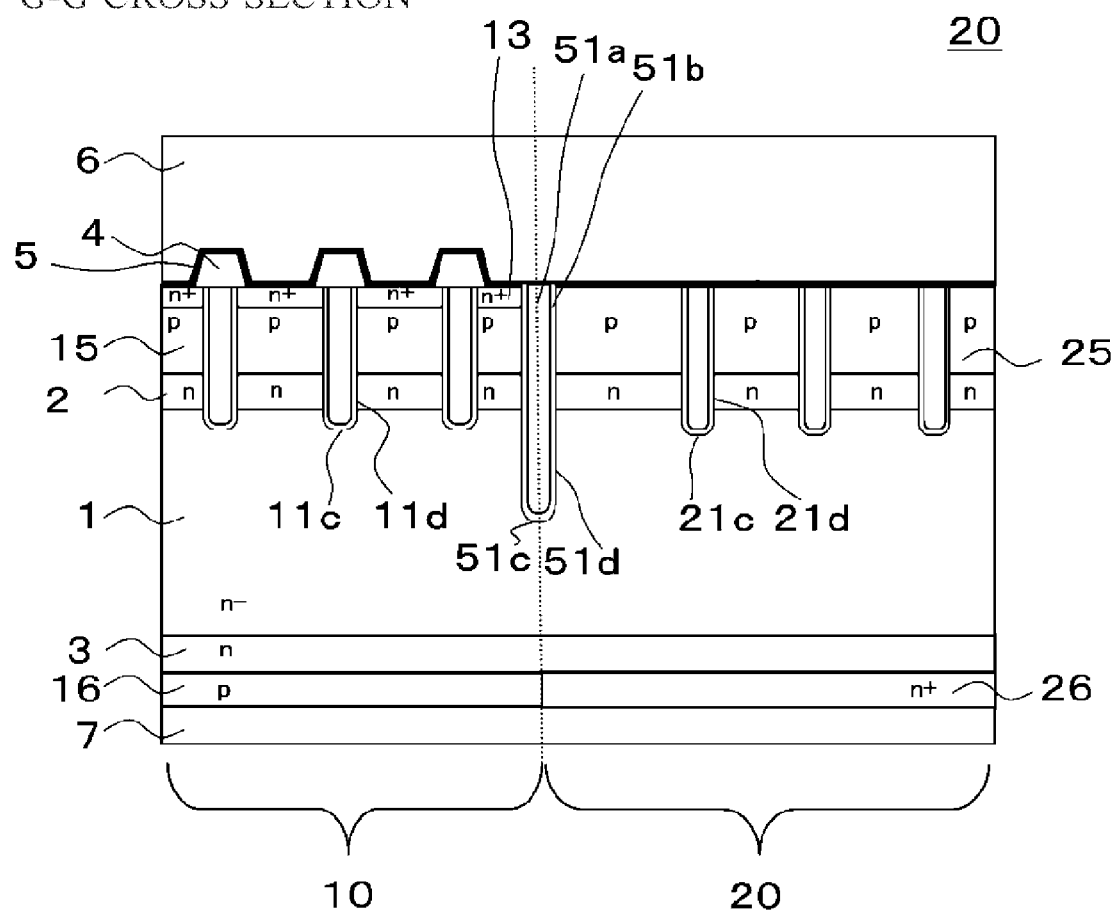
FIG. 24 is a cross-sectional view illustrating the semiconductor device according to the fourth embodiment.

The configuration of a semiconductor device according to a fourth embodiment is described with reference to FIG. 24. FIG. 24 is a cross-sectional view illustrating the semiconductor device according to the fourth embodiment. In the fourth embodiment, the same components as those described in the first embodiment to the third embodiment are denoted by the same reference characters and description thereof is omitted.

As illustrated in FIG. 24, the interval between the active trench gate 11 on the IGBT region 10 side that is the closest to the boundary trench gate 51 and the boundary trench gate 51 is narrower than the interval between the dummy trench gate 21 on the diode region 20 side that is the closest to the boundary trench gate 51 and the boundary trench gate 51. As described above, by forming the boundary trench gate 51 that suppresses the flow-in of the electron holes from the IGBT region 10 to the diode region 20 to be close to the IGBT region 10, the course of the electron holes can be easily blocked. As a result, the route through which the electron holes pass between the p-type base layer 15 and the cathode layer 26 can be extended.

Therefore, in the fourth embodiment, by providing a configuration in which the interval between the active trench gate 11 on the IGBT side that is the closest to the boundary trench gate 51 and the boundary trench gate 51 is narrower than the interval between the dummy trench gate 21 on the diode side that is the closest to the boundary trench gate 51 and the boundary trench gate 51, the movement of the electron holes from the p-type base layer 15 in the IGBT region 10 to the cathode layer 26 in the diode region 20 can be suppressed more. As a result, the recovery current can be suppressed and the breakdown resistance at the time of the recovery operation can be improved.

Fifth Embodiment

Figure 25:
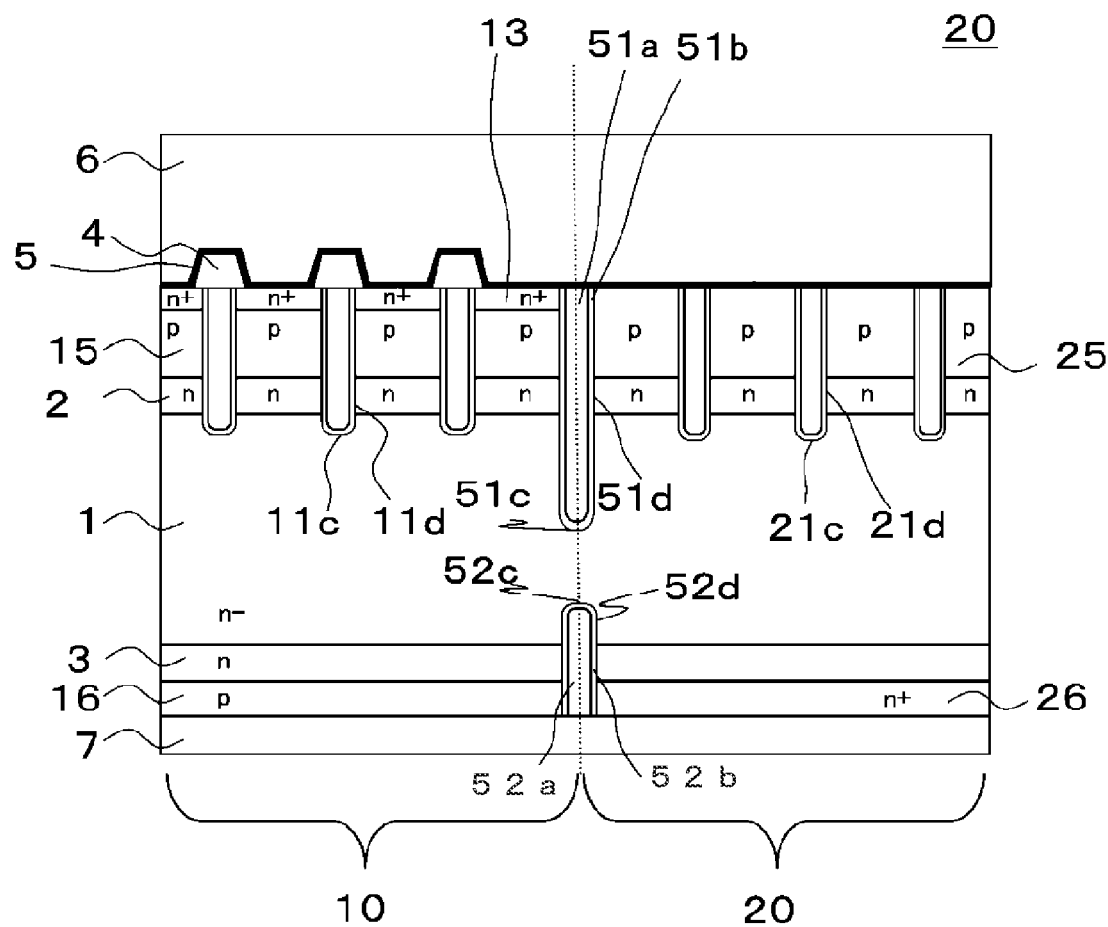
FIG. 25 is a cross-sectional view illustrating the semiconductor device according to the fifth embodiment.

The configuration of a semiconductor device according to a fifth embodiment is described with reference to FIG. 25. FIG. 25 is a cross-sectional view illustrating the semiconductor device according to the fifth embodiment. In the fifth embodiment, the same components as those described in the first embodiment to the fourth embodiment are denoted by the same reference characters and description thereof is omitted.

As illustrated in FIG. 25, a rear-surface dummy trench gate 52 is provided so as to pass through the p-type collector layer 16 and the n+ type cathode layer 26 from the second main surface in the first main surface direction. The rear-surface dummy trench gate 52 has a rear-surface trench electrode 52a in a rear-surface trench formed in the semiconductor substrate via a rear-surface trench insulating film 52b. The rear-surface dummy trench gate 52 is provided in a position that faces the p-type collector layer 16, the n+ type cathode layer 26, and the n− type drift layer 1 at the boundary between the IGBT region 10 and the diode region 20. The rear-surface dummy trench gate 52 has a bottom surface 52c of the rear-surface trench in a position opposite to the bottom surface 51c of the boundary trench gate, and includes a side wall 52d of the rear-surface trench in a position that connects the bottom surface 52c and the second main surface to each other. By the configuration as above, the flow-in of the electron holes can be suppressed also by the rear-surface dummy trench gate 52 in addition to the boundary trench gate 51 that suppresses the flow-in of the electron holes from the IGBT region 10 to the diode region 20.

Therefore, in the fifth embodiment, by providing the rear-surface dummy trench gate 52 in addition to the boundary trench gate 51, the movement of the electron holes from the p-type base layer 15 in the IGBT region 10 to the cathode layer 26 in the diode region 20 can be suppressed more. As a result, the recovery current can be suppressed and the breakdown resistance at the time of the recovery operation can be improved.

Several embodiments of the present disclosure have been described, but those embodiments are presented as examples. Various omissions, replacements, and modifications can be made without departing from the gist thereof. The embodiments can be combined with each other.

According to the semiconductor device according to the present disclosure, by providing the boundary trench having a bottom surface that is deeper than the bottom surface of the trench in the IGBT region and the bottom surface of the trench in the diode region between the IGBT region and the diode region adjacent to the IGBT region, the flow-in of the electron holes to the diode region can be suppressed and the breakdown resistance at the time of the recovery operation can be improved.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2020-097609, filed on Jun. 4, 2020 including specification, claims, drawings and summary, on which the Convention priority of the present application is based, are incorporated herein by reference in its entirety.

The invention claimed is:

1. A semiconductor device, comprising:
a semiconductor substrate having a first-conductivity-type drift layer between a first main surface and a second main surface opposite to the first main surface; and
an IGBT region and a diode region provided to be adjacent to each other in the semiconductor substrate, wherein:
the IGBT region includes:
a second-conductivity-type base layer provided on a front layer of the semiconductor substrate on the first main surface side;
a first-conductivity-type emitter layer selectively provided on a front layer of the base layer on the first main surface side;
an active trench gate including an active trench gate electrode, which is provided so as to face the drift layer via an insulating film and to which a gate voltage is applied, in each of a plurality of active trenches that are formed to be aligned in a first direction along the first main surface of the semiconductor substrate and pass through the emitter layer and the base layer; and
a second-conductivity-type collector layer provided on a front layer of the semiconductor substrate on the second main surface side;
the diode region includes:
a second-conductivity-type anode layer provided on the front layer of the semiconductor substrate on the first main surface side;
a first-conductivity-type cathode layer provided on the front layer of the semiconductor substrate on the second main surface side; and
a dummy trench gate having a dummy trench gate electrode, which faces the drift layer via an insulating film and to which the gate voltage is not applied, in each of a plurality of dummy trenches that are formed to be aligned in the first direction of the semiconductor substrate and pass through the anode layer; and
the semiconductor device further comprises:
a boundary trench having, in a position in which the IGBT region and the diode region are adjacent to each other in plan view, a bottom surface positioned in the drift layer to be deeper than the active trench or the dummy trench, and one side wall and another side wall that face each other and connect the bottom surface and the first main surface to each other; and
a boundary trench gate electrode, which faces the base layer, the anode layer, and the drift layer via a boundary trench insulating film and is provided from the one side wall side to the other side wall side of the boundary trench across a region that faces the drift layer, in the boundary trench in which the bottom surface, the one side wall, and the other side wall are covered with the boundary trench insulating film.

2. The semiconductor device according to claim 1, wherein the collector layer and the cathode layer are at least partially in contact with each other in a position opposite to the bottom surface.

3. The semiconductor device according to claim 1, wherein the base layer and the anode layer are at a same depth in a direction toward the second main surface from the first main surface.

4. The semiconductor device according to claim 1, wherein the bottom surface of the boundary trench is deeper than a bottom surface of an active trench and is at a same depth as a bottom surface of the dummy trench.

5. The semiconductor device according to claim 4, wherein a trench width of the boundary trench and a trench width of the dummy trench are wider than a trench width of the active trench.

6. The semiconductor device according to claim 1, wherein the bottom surface of the boundary trench is deeper than a bottom surface of the dummy trench and is at a same depth as a bottom surface of the active trench.

7. The semiconductor device according to claim 6, wherein a trench width of the boundary trench and a trench width of the active trench are wider than a trench width of the dummy trench.

8. The semiconductor device according to claim 1, further comprising, in a position in which a depth from the first main surface is deeper than the base layer, a first-conductivity-type carrier accumulation layer that faces the base layer.

9. The semiconductor device according to claim 1, wherein:
the boundary trench is positioned between the dummy trench and the active trench; and
an interval between the boundary trench and the active trench is narrower than an interval between the boundary trench and the dummy trench.

10. The semiconductor device according to claim 1, further comprising a rear-surface dummy trench having: a rear-surface dummy trench bottom surface in a position opposite to the bottom surface of the boundary trench; and a rear-surface dummy trench side wall that connects the rear-surface dummy trench bottom surface and the second main surface to each other, wherein
the rear-surface dummy trench faces the collector layer, the cathode layer, and the drift layer.

11. The semiconductor device according to claim 1, wherein:
a plurality of the dummy trenches and the active trenches are provided; and
an interval between the plurality of dummy trenches is wider than an interval between the plurality of active trenches.

12. The semiconductor device according to claim 1, wherein:
a plurality of the dummy trenches and the active trenches are provided; and
an interval between the plurality of active trenches is wider than an interval between the plurality of dummy trenches.

* * * * *